United States Patent
Kagajwala et al.

(10) Patent No.: US 10,923,340 B2
(45) Date of Patent: *Feb. 16, 2021

(54) APPARATUS AND METHOD FOR ELECTRODEPOSITION OF METALS WITH THE USE OF AN IONICALLY RESISTIVE IONICALLY PERMEABLE ELEMENT HAVING SPATIALLY TAILORED RESISTIVITY

(71) Applicant: Lam Research Corporation, Fremont, CA (US)

(72) Inventors: Burhanuddin Kagajwala, Hillsboro, OR (US); Bryan L. Buckalew, Tualatin, OR (US); Lee Peng Chua, Beaverton, OR (US); Aaron Berke, Portland, OR (US); Robert Rash, West Linn, OR (US); Steven T. Mayer, Aurora, OR (US)

(73) Assignee: Lam Research Corporation, Fremont, CA (US)

( * ) Notice: Subject to any disclaimer, the term of this patent is extended or adjusted under 35 U.S.C. 154(b) by 87 days.

This patent is subject to a terminal disclaimer.

(21) Appl. No.: 15/995,974

(22) Filed: Jun. 1, 2018

(65) Prior Publication Data

US 2018/0286660 A1    Oct. 4, 2018

Related U.S. Application Data

(63) Continuation of application No. 14/712,553, filed on May 14, 2015, now Pat. No. 10,014,170.

(51) Int. Cl.
*C25D 17/00* (2006.01)
*H01L 21/02* (2006.01)
*H01L 21/288* (2006.01)

(52) U.S. Cl.
CPC ...... *H01L 21/02002* (2013.01); *C25D 17/001* (2013.01); *C25D 17/008* (2013.01);
(Continued)

(58) Field of Classification Search
CPC ........ C25D 17/001; C25D 7/12; C25D 21/12; C25D 5/18; C25D 17/10; C25D 17/00
(Continued)

(56) References Cited

U.S. PATENT DOCUMENTS 3,652,442 A  3/1972  Powers et al.
3,706,651 A  12/1972  Leland
(Continued)

FOREIGN PATENT DOCUMENTS

CN  1582491 A  2/2005
CN  1624207 A  6/2005
(Continued)

OTHER PUBLICATIONS

U.S. Office Action dated Aug. 26, 2016 issued in U.S. Appl. No. 14/251,108.
(Continued)

*Primary Examiner* — Zulmariam Mendez
(74) *Attorney, Agent, or Firm* — Weaver Austin Villeneuve & Sampson LLP

(57) ABSTRACT

An apparatus for electroplating metal on a semiconductor substrate with improved plating uniformity includes in one aspect: a plating chamber configured to contain an electrolyte and an anode; a substrate holder configured to hold the semiconductor substrate; and an ionically resistive ionically permeable element comprising a substantially planar substrate-facing surface and an opposing surface, wherein the element allows for flow of ionic current towards the substrate during electroplating, and wherein the element comprises a region having varied local resistivity. In one
(Continued)

example the resistivity of the element is varied by varying the thickness of the element. In some embodiments the thickness of the element is gradually reduced in a radial direction from the edge of the element to the center of the element. The provided apparatus and methods are particularly useful for electroplating metal in WLP recessed features.

22 Claims, 14 Drawing Sheets

(52) U.S. Cl.
CPC ........ *H01L 21/2885* (2013.01); *C25D 17/002* (2013.01); *C25D 17/007* (2013.01)

(58) Field of Classification Search
USPC ....................................................... 205/123
See application file for complete search history.

(56) References Cited

U.S. PATENT DOCUMENTS

| | | | |
|---|---|---|---|
| 3,862,891 A | 1/1975 | Smith | |
| 4,033,833 A | 7/1977 | Bestel et al. | |
| 4,082,638 A | 4/1978 | Jumer | |
| 4,240,886 A | 12/1980 | Hodges et al. | |
| 4,272,335 A | 6/1981 | Combs | |
| 4,304,641 A | 12/1981 | Grandia et al. | |
| 4,389,297 A | 6/1983 | Korach | |
| 4,409,339 A | 10/1983 | Matsuda et al. | |
| 4,469,564 A | 9/1984 | Okinaka et al. | |
| 4,545,877 A | 10/1985 | Hillis | |
| 4,604,177 A | 8/1986 | Siyilotti | |
| 4,604,178 A | 8/1986 | Flegener et al. | |
| 4,605,482 A | 8/1986 | Shirgami et al. | |
| 4,696,729 A | 9/1987 | Santini | |
| 4,828,654 A | 5/1989 | Reed | |
| 4,906,346 A | 3/1990 | Hadersbeck et al. | |
| 4,931,149 A | 6/1990 | Stierman et al. | |
| 4,933,061 A | 6/1990 | Kulkarni et al. | |
| 5,000,827 A | 3/1991 | Schuster et al. | |
| 5,035,784 A | 7/1991 | Anderson et al. | |
| 5,039,381 A | 8/1991 | Mullarkey | |
| 5,078,852 A | 1/1992 | Yee et al. | |
| 5,096,550 A | 3/1992 | Mayer et al. | |
| 5,146,136 A | 9/1992 | Ogura et al. | |
| 5,156,730 A | 10/1992 | Bhatt et al. | |
| 5,162,079 A | 11/1992 | Brown | |
| 5,217,586 A | 6/1993 | Datta et al. | |
| 5,316,642 A | 5/1994 | Young, Jr. et al. | |
| 5,332,487 A | 7/1994 | Young et al. | |
| 5,368,711 A | 11/1994 | Poris | |
| 5,391,285 A | 2/1995 | Lytle et al. | |
| 5,421,987 A | 6/1995 | Tzanavaras et al. | |
| 5,443,707 A | 8/1995 | Mori | |
| 5,452,053 A | 9/1995 | Nozue | |
| 5,472,592 A | 12/1995 | Lowery | |
| 5,476,578 A | 12/1995 | Forand | |
| 5,498,325 A | 3/1996 | Nishimura et al. | |
| 5,516,412 A | 5/1996 | Andricacos et al. | |
| 5,567,300 A | 10/1996 | Datta et al. | |
| 5,660,699 A | 8/1997 | Saito et al. | |
| 5,723,028 A | 3/1998 | Poris | |
| 5,744,019 A | 4/1998 | Ang | |
| 5,816,900 A | 10/1998 | Nagahara et al. | |
| 5,935,402 A | 8/1999 | Fanti | |
| 6,004,440 A | 12/1999 | Hanson et al. | |
| 6,027,631 A | 2/2000 | Broadbent | |
| 6,080,291 A | 6/2000 | Woodruff et al. | |
| 6,106,687 A | 8/2000 | Edelstein | |
| 6,126,798 A | 10/2000 | Reid et al. | |
| 6,132,587 A | 10/2000 | Jorné et al. | |
| 6,132,805 A | 10/2000 | Moslehi | |
| 6,156,167 A | 12/2000 | Patton et al. | |
| 6,179,983 B1 | 1/2001 | Reid et al. | |
| 6,193,860 B1 | 2/2001 | Weling | |
| 6,228,231 B1 | 5/2001 | Uzoh | |
| 6,251,255 B1 | 6/2001 | Copping et al. | |
| 6,261,433 B1 | 7/2001 | Landau | |
| 6,368,475 B1 | 4/2002 | Hanson et al. | |
| 6,391,166 B1 | 5/2002 | Wang | |
| 6,391,188 B1 | 5/2002 | Goosey | |
| 6,395,152 B1 | 5/2002 | Wang | |
| 6,398,926 B1 | 6/2002 | Mahneke | |
| 6,402,923 B1 | 6/2002 | Mayer et al. | |
| 6,497,801 B1 | 12/2002 | Woodruff et al. | |
| 6,521,102 B1 | 2/2003 | Dordi | |
| 6,527,920 B1 | 3/2003 | Mayer et al. | |
| 6,551,483 B1 | 4/2003 | Mayer et al. | |
| 6,569,299 B1 | 5/2003 | Reid et al. | |
| 6,627,051 B2 | 9/2003 | Berner et al. | |
| 6,632,335 B2 | 10/2003 | Kunisawa et al. | |
| 6,692,588 B1 | 2/2004 | Uzoh et al. | |
| 6,755,954 B2 | 6/2004 | Mayer et al. | |
| 6,773,571 B1 | 8/2004 | Mayer et al. | |
| 6,800,187 B1 | 10/2004 | Reid et al. | |
| 6,821,407 B1 | 11/2004 | Reid et al. | |
| 6,890,416 B1 | 5/2005 | Mayer et al. | |
| 6,919,010 B1 | 7/2005 | Mayer et al. | |
| 6,921,468 B2 | 7/2005 | Graham et al. | |
| 6,964,792 B1 | 11/2005 | Mayer et al. | |
| 7,070,686 B2 | 7/2006 | Contolini et al. | |
| 7,141,146 B2 | 11/2006 | Bogart et al. | |
| 7,169,705 B2 | 1/2007 | Ide et al. | |
| D544,452 S | 6/2007 | Nakamura et al. | |
| D548,705 S | 8/2007 | Hayashi | |
| D552,565 S | 10/2007 | Nakamura et al. | |
| D553,104 S | 10/2007 | Oohashi et al. | |
| D587,222 S | 2/2009 | Sasaki et al. | |
| 7,622,024 B1 | 11/2009 | Mayer et al. | |
| 7,641,776 B2 | 1/2010 | Nagar et al. | |
| D609,652 S | 2/2010 | Nagasaka et al. | |
| D609,655 S | 2/2010 | Sugimoto | |
| 7,670,465 B2 | 3/2010 | Yang et al. | |
| D614,593 S | 4/2010 | Lee et al. | |
| 7,837,841 B2 | 11/2010 | Chen et al. | |
| 7,854,828 B2 | 12/2010 | Reid et al. | |
| 7,935,240 B2 | 5/2011 | Singh et al. | |
| 7,967,969 B2 | 6/2011 | Mayer et al. | |
| D648,289 S | 11/2011 | Mayer et al. | |
| 8,308,931 B2 | 11/2012 | Reid et al. | |
| 8,475,636 B2 | 7/2013 | Mayer et al. | |
| 8,475,644 B2 | 7/2013 | Mayer et al. | |
| 8,603,305 B2 | 12/2013 | Rash et al. | |
| 8,623,193 B1 | 1/2014 | Mayer et al. | |
| 8,795,480 B2 | 8/2014 | Mayer et al. | |
| 9,309,604 B2 | 4/2016 | Mayer et al. | |
| 9,670,588 B2 | 6/2017 | He | |
| 9,816,194 B2 | 11/2017 | He et al. | |
| 10,014,170 B2 | 7/2018 | Kagajwala et al. | |
| 10,301,739 B2 | 5/2019 | He | |
| 2001/0050233 A1 | 12/2001 | Uzoh et al. | |
| 2002/0008037 A1 | 1/2002 | Wilson et al. | |
| 2002/0017456 A1 | 2/2002 | Graham et al. | |
| 2002/0020627 A1 | 2/2002 | Kunisawa et al. | |
| 2002/0119671 A1 | 8/2002 | Lee | |
| 2002/0125141 A1 | 9/2002 | Wilson et al. | |
| 2003/0029527 A1 | 2/2003 | Yajima et al. | |
| 2003/0038035 A1 | 2/2003 | Wilson et al. | |
| 2003/0079995 A1 | 5/2003 | Contolini et al. | |
| 2003/0087522 A1 | 5/2003 | Ngo et al. | |
| 2003/0102210 A1 | 6/2003 | Woodruff et al. | |
| 2003/0199156 A1 | 10/2003 | Fujii | |
| 2003/0201166 A1 | 10/2003 | Zheng et al. | |
| 2004/0026257 A1 | 2/2004 | Gonzalez et al. | |
| 2004/0149584 A1 | 8/2004 | Nagai et al. | |
| 2005/0145499 A1 | 7/2005 | Kovarsky et al. | |
| 2005/0202346 A1 | 9/2005 | Yamano | |
| 2006/0000704 A1 | 1/2006 | Sato et al. | |
| 2006/0243598 A1 | 11/2006 | Singh et al. | |
| 2007/0029193 A1 | 2/2007 | Brcka | |
| 2007/0068819 A1 | 3/2007 | Singh et al. | |
| 2007/0238265 A1 | 10/2007 | Kurashina et al. | |

(56) References Cited

U.S. PATENT DOCUMENTS

| | | | |
|---|---|---|---|
| 2010/0032304 | A1 | 2/2010 | Mayer et al. |
| 2010/0032310 | A1 | 2/2010 | Reid et al. |
| 2010/0044236 | A1 | 2/2010 | Mayer et al. |
| 2010/0116672 | A1 | 5/2010 | Mayer et al. |
| 2011/0031112 | A1 | 2/2011 | Birang et al. |
| 2012/0000786 | A1 | 1/2012 | Mayer et al. |
| 2012/0261254 | A1 | 10/2012 | Reid et al. |
| 2013/0137242 | A1 | 5/2013 | He et al. |
| 2013/0313123 | A1 | 11/2013 | Abraham et al. |
| 2013/0327650 | A1 | 12/2013 | Mayer et al. |
| 2014/0124361 | A1 | 5/2014 | Reid et al. |
| 2014/0326608 | A1 | 11/2014 | He |
| 2016/0222535 | A1 | 8/2016 | Zhou et al. |
| 2016/0273119 | A1 | 9/2016 | He et al. |
| 2016/0333495 | A1 | 11/2016 | Kagajwala et al. |
| 2017/0236715 | A1 | 8/2017 | He |

FOREIGN PATENT DOCUMENTS

| | | | |
|---|---|---|---|
| CN | 1705774 | A | 12/2005 |
| CN | 101056718 | A | 10/2007 |
| CN | 100487855 | C | 5/2009 |
| CN | 101736376 | A | 6/2010 |
| CN | 101925981 | A | 12/2010 |
| CN | 102296344 | A | 12/2011 |
| CN | 301883011 | S | 4/2012 |
| CN | 102459717 | A | 5/2012 |
| CN | 102560612 | A | 7/2012 |
| CN | 102732925 | A | 10/2012 |
| CN | 104131327 | A | 11/2014 |
| EP | 0037325 | | 3/1981 |
| JP | 59-162298 | | 9/1984 |
| JP | 09-53197 | | 2/1997 |
| JP | 2001-316887 | | 11/2001 |
| JP | 2003-268591 | | 9/2003 |
| KR | 10-2006-0043811 | A | 5/2006 |
| KR | 1020060048645 | A | 5/2006 |
| KR | 10-0707121 | | 4/2007 |
| KR | 0657600 | | 8/2012 |
| TW | 223678 | | 11/2004 |
| TW | 201107536 | A | 3/2011 |
| TW | D148167 | | 7/2012 |
| WO | WO 1999/041434 | | 8/1999 |
| WO | WO 2005/043593 | | 5/2005 |
| WO | WO 2010/144330 | | 12/2010 |

OTHER PUBLICATIONS

U.S. Notice of Allowance dated Feb. 3, 2017 issued in U.S. Appl. No. 14/251,108.
U.S. Notice of Allowance [Corrected Notice of Allowability] dated May 10, 2017 issued in U.S. Appl. No. 14/251,108.
U.S. Notice of Allowance dated Jul. 19, 2017 issued in U.S. Appl. No. 14/662,823.
U.S. Office Action dated Feb. 23, 2017 issued in U.S. Appl. No. 14/712,553.
U.S. Final Office Action dated Oct. 3, 2017 issued in U.S. Appl. No. 14/712,553.
U.S. Notice of Allowance dated Mar. 2, 2018 issued in U.S. Appl. No. 14/712,553.
U.S. Office Action dated Oct. 26, 2007 issued in U.S. Appl. No. 11/040,359.
U.S. Final Office Action dated Jul. 25, 2008 issued in U.S. Appl. No. 11/040,359.
U.S. Office Action dated Jan. 8, 2009 issued in U.S. Appl. No. 11/040,359.
U.S. Notice of Allowance dated Jul. 20, 2009 issued in U.S. Appl. No. 11/040,359.
U.S. Office Action dated Oct. 6, 2010 issued in U.S. Appl. No. 12/578,310.
U.S. Notice of Allowance dated Mar. 4, 2011 issued in U.S. Appl. No. 12/578,310.
U.S. Office Action dated Oct. 5, 2012 issued in U.S. Appl. No. 13/110,759.
U.S. Final Office Action dated Mar. 29, 2013 issued in U.S. Appl. No. 13/110,759.
U.S. Notice of Allowance dated Sep. 11, 2013 issued in U.S. Appl. No. 13/110,759.
U.S. Office Action dated Sep. 19, 2011 issued in U.S. Appl. No. 12/291,356.
U.S. Final Office Action dated Feb. 27, 2012 issued in U.S. Appl. No. 12/291,356.
U.S. Notice of Allowance dated Jul. 27, 2012 issued in U.S. Appl. No. 12/291,356.
U.S. Office Action dated Jun. 24, 2011 issued in U.S. Appl. No. 12/481,503.
U.S. Final Office Action dated Mar. 1, 2012 issued in U.S. Appl. No. 12/481,503.
U.S. Office Action dated Jul. 9, 2012 issued in U.S. Appl. No. 12/481,503.
U.S. Final Office Action dated Dec. 19, 2012 issued in U.S. Appl. No. 12/481,503.
U.S. Notice of Allowance dated Mar. 1, 2013 issued in U.S. Appl. No. 12/481,503.
U.S. Office Action dated Jun. 24, 2011 issued in U.S. Appl. No. 12/606,030.
U.S. Final Office Action dated Mar. 1, 2012 issued in U.S. Appl. No. 12/606,030.
U.S. Office Action dated Jun. 28, 2012 issued in U.S. Appl. No. 12/606,030.
U.S. Office Action dated Jul. 13, 2012 issued in U.S. Appl. No. 12/606,030.
U.S. Final Office Action dated Dec. 17, 2012 issued in U.S. Appl. No. 12/606,030.
U.S. Notice of Allowance dated Mar. 1, 2013 issued in U.S. Appl. No. 12/606,030.
U.S. Office Action dated Jul. 29, 2015 issued in U.S. Appl. No. 13/907,265.
U.S. Notice of Allowance dated Dec. 30, 2015 issued in U.S. Appl. No. 13/907,265.
U.S. Office Action, dated May 23, 2013, issued in U.S. Appl. No. 13/108,881.
U.S. Final Office Action, dated Oct. 25, 2013, issued in U.S. Appl. No. 13/108,881.
U.S. Office Action, dated Oct. 22, 2015, issued in U.S. Appl. No. 14/153,582.
U.S. Office Action, dated May 9, 2016, issued in U.S. Appl. No. 14/153,582.
U.S. Office Action, dated Dec. 2, 2016, issued in U.S. Appl. No. 14/153,582.
U.S. Notice of Allowance dated Aug. 10, 2011 issued in Design U.S. Appl. No. 29/377,521.
Chinese First Office Action dated Jan. 29, 2016 issued in Application No. CN 201410183216.6.
Chinese Second Office Action dated Sep. 27, 2016 issued in Application No. CN 201410183216.6.
Chinese Third Action dated Mar. 28, 2017 issued in Application No. CN 201410183216.6.
Chinese First Office Action dated Oct. 20, 2017 issued in Application No. CN 201610318396.3.1.
Chinese First Office Action dated May 15, 2013 issued in Application No. CN 200910209697.2.
Chinese Second Office Action dated Dec. 10, 2013 issued in Application No. CN 200910209697.2.
PCT International Search Report and Written Opinion dated Jan. 12, 2011 issued in Application No. PCT/US2010/037520.
PCT International Preliminary Report on Patentability and Written Opinion dated Dec. 22, 2011 issued in Application No. PCT/US2010/037520.
Chinese First Office Action dated Nov. 6, 2013 issued in Application No. CN 201080032109.3.
Chinese Second Office Action dated Jun. 10, 2014 issued in Application No. CN 201080032109.3.
Korean First Office Action dated Jun. 23, 2016 issued in Application No. KR 10-2012-7000614.

(56) References Cited

OTHER PUBLICATIONS

Taiwan Office Action dated Jul. 31, 2014 issued in Application No. TW 099118603.
Chinese First Office Action dated Jul. 20, 2015 issued in Application No. CN 201210108100.7.
Chinese Second Office Action dated Feb. 25, 2016 issued in Application No. CN 201210108100.7.
Taiwan Office Action dated Jan. 20, 2016 issued in Application No. TW 101113319.
Chinese Office Action dated Jul. 19, 2011 issued in Application No. CN 201130081716.6.
Taiwan Office Action dated Nov. 28, 2011 issued in Application No. TW 100301923.
Korean Office Action dated Apr. 20, 2012 issued in Application No. KR 2011-0012881.
Fang et al. (2004) "Uniform Copper Electroplating on Resistive Substrates," Abs. 167, 205$^{th}$ Meeting, *The Electrochemical Society, Inc.*, 1 page.
Malmstadt et al. (1994) "Microcomputers and Electronic Instrumentation: Making the Right Connections," *American Chemical Society*, p. 255 (3pp).
"Release of Sabre™ electrofill tool with HRVA by Novellus Systems, Inc." no earlier than Aug. 2005. (3 pages).
U.S. Notice of Allowance dated Jan. 23, 2019 issued in U.S. Appl. No. 15/583,592.
Taiwanese First Office Action dated May 16, 2018 issued in Application No. TW 103115586.
Chinese Second Office Action dated Nov. 5, 2018 issued in Application No. CN 201610318396.3.
Taiwanese First Office Action dated Dec. 18, 2019 issued in Application No. TW 105114493.
Korean Office Action dated May 9, 2018 issued in Application No. KR 10-2012-0038891.
Chinese First Office Action dated Apr. 28, 2019 issued in Application No. CN 201810195785.0.
Taiwanese Second Office Action dated Aug. 31, 2020 issued in Application No. TW 105114493.
Korean Office Action dated Sep. 1, 2020 issued in Application No. KR 10-2014-0052594.

APPARATUS AND METHOD FOR ELECTRODEPOSITION OF METALS WITH THE USE OF AN IONICALLY RESISTIVE IONICALLY PERMEABLE ELEMENT HAVING SPATIALLY TAILORED RESISTIVITY

CROSS-REFERENCE TO RELATED APPLICATIONS

This application is a continuation of U.S. application Ser. No. 14/712,553 filed May 14, 2015 titled "Apparatus and Method for Electrodeposition of Metals with the Use of an Ionically Resistive Ionically Permeable Element Having Spatially Tailored Resistivity", naming Kagajwala et al. as inventors, which is herein incorporated by reference in its entirety.

FIELD OF THE INVENTION

The present disclosure relates generally to a method and apparatus for electroplating a metal layer on a semiconductor wafer. More particularly, the method and apparatus described herein are useful for controlling plating uniformity.

BACKGROUND

In semiconductor device manufacturing, a conductive material, such as copper, is often deposited by electroplating onto a seed layer of metal to fill one or more recessed features on a semiconductor wafer substrate. Electroplating is a method of choice for depositing metal into the vias and trenches of the wafer during damascene processing, and is also used in wafer level packaging (WLP) applications to form pillars and lines of metal on the wafer substrate. Another application of electroplating is filling of Through-Silicon Vias (TSVs), which are relatively large vertical electrical connections used in 3D integrated circuits and 3D packages.

In some electroplating substrates, the seed layer is exposed over the entire surface of the substrate prior to electroplating (typically in damascene and TSV processing), and electrodeposition of metal occurs over the entirety of the substrate. In other electroplating substrates, a portion of the seed layer is covered by a non-conducting material, such as by photoresist, while another portion of the seed layer is exposed. In such substrates with partially masked seed layer electroplating occurs only over the exposed portions of the seed layer, while the covered portions of the seed layer are protected from being plated upon. Electroplating on a substrate having a seed layer that is coated with patterned photoresist is referred to as through resist plating and is typically used in WLP applications.

During electroplating, electrical contacts are made to the seed layer (e.g., a copper seed layer) at the periphery of the wafer, and the wafer is electrically biased to serve as a cathode. The wafer is brought into contact with an electrolyte, which contains ions of metal to be plated. The electrolyte typically also includes an acid that provides sufficient conductivity to the electrolyte and may also contain additives, known as accelerators, suppressors, and levelers that modulate electrodeposition rates on different surfaces of the substrate.

One of the problems encountered during electroplating is non-uniform distribution of thickness of electrodeposited metal along the radius of the circular semiconductor wafer. This type of non-uniformity is known as radial non-uniformity. Radial non-uniformity may occur due to a variety of factors, such as due to a terminal effect, and due to variations in electrolyte flow at the surface of the substrate. Terminal effect manifests itself in edge-thick electroplating, because the potential in the vicinity of the electrical contacts at the edge of the wafer can be significantly higher than at the center of the wafer, particularly if a thin resistive seed layer is used.

Another type of non-uniformity, which can be encountered during electroplating is azimuthal non-uniformity. For clarity, we define azimuthal non-uniformity, using polar coordinates, as thickness variations exhibited at different angular positions on the wafer at a fixed radial position from the wafer center, that is, a non-uniformity along a given circle or portion of a circle within the perimeter of the wafer. This type of non-uniformity can be present in electroplating applications, independently of radial non-uniformity, and in some applications may be the predominant type of non-uniformity that needs to be controlled. It often arises in through resist plating, where a major portion of the wafer is masked with a photoresist coating or similar plating-preventing layer, and the masked pattern of features or feature densities are not azimuthally uniform near the wafer edge. For example, in some cases there may be a technically required chord region of missing pattern features near the notch of the wafer to allow for wafer numbering or handling.

Excessive radial and azimuthal non-uniformity can lead to non-functional chips. Therefore methods and apparatus for improving plating uniformity are needed.

SUMMARY OF THE INVENTION

Described are method and apparatus for electroplating metal on a substrate with improved plating uniformity. Apparatus and methods described herein can be used for electroplating on a variety of substrates, and are particularly useful for through resist plating during WLP processing. The apparatus and methods make use of an ionically resistive ionically permeable element having spatially tailored resistivity that is positioned in proximity of the substrate during electroplating and is configured to target the selected type of non-uniformity. For example radial non-uniformity due to terminal effect is mitigated by using an ionically resistive ionically permeable element positioned in close proximity to the wafer, wherein the element is more resistive at the edge than at the center. The resistivity can be spatially varied by spatially varying the thickness of the element, the porosity of the element, or a combination of thickness and porosity.

In one aspect of the invention an electroplating apparatus is provided, wherein the apparatus includes (a) a plating chamber configured to contain an electrolyte and an anode while electroplating metal onto a semiconductor substrate; (b) a substrate holder configured to hold the semiconductor substrate such that a plating face of the semiconductor substrate is separated from the anode during electroplating; and (c) an ionically resistive ionically permeable element comprising a substantially planar substrate-facing surface and an opposing surface, wherein the element allows for flow of ionic current through the element towards the substrate during electroplating, and wherein the element comprises a region having varied local resistivity. In some embodiments the local resistivity is varied gradually in the region having varied local resistivity.

In one example the region having varied local resistivity is coextensive with the element (i.e. the region is the entire element) and the local resistivity in this region decreases radially from an edge of the element to the center of the element. This embodiment is particularly useful for mitigating terminal effect, particularly when depositing metal in WLP features.

In another example, the element includes a region of constant local resistivity surrounding the region of varied local resistivity, wherein the region of varied local resistivity is located in a central portion of the element and wherein the local resistivity in the region of varied local resistivity decreases radially from an interface with the region of constant resistivity to the center of the element. This embodiment is particularly useful for addressing non-uniformity that arises due to thicker photoresist layer in the center of the semiconductor substrate encountered in through-resist electroplating.

The resistivity of the element can be varied using a number of approaches. In one approach, the element has a varied thickness and constant porosity in the region having varied local resistivity. The variation in thickness is preferably, but not necessarily, gradual. In another approach, the element has varied porosity (preferably gradually varied porosity) and constant thickness in the region having varied local resistivity. A combination of these approaches can also be used. For example, in some embodiments, the element has both gradually varied porosity and gradually varied thickness in the region having varied local resistivity.

In some embodiments, the element has a plurality of non-communicating channels made through an ionically resistive material and connecting the substrate-facing surface of the element with the opposite surface of the element, wherein the element allows for movement of the electrolyte through the channels towards the substrate. In some embodiments the region having varied local resistivity has a gradually varied density of the non-communicating channels. In some embodiments the region having varied local resistivity has a gradual variation in diameter of the non-communicating channels. In some embodiments the region having varied local resistivity has a gradual variation in an incline angle of the non-communicating channels relative to a plane defined by the plating face of the substrate. All combinations of these embodiments (variation of channel density, variation of channel diameter, and variation of incline angle) can also be used to provide variation in resistivity.

In one specific example, that employs variation of thickness to achieve resistivity variation, the region having varied local resistivity is coextensive with the element and the local resistivity in this region decreases radially from an edge of the element to the center of the element due to gradually decreasing thickness of the element from the edge of the element to the center of the element. In some embodiments of this example the opposite surface of the element is a convex surface that follows a second order polynomial function, when viewed in a radial cross-section.

In another specific example that employs variation of thickness to achieve resistivity variation, the element includes a region of constant thickness surrounding the region having varied local resistivity, wherein the region having varied local resistivity is located in a central portion of the element and wherein the thickness of the element in the region having gradually varied local resistivity decreases radially from an interface with the region of constant thickness to the center of the element.

In those embodiments, where variation of thickness is used to achieve the variation of resistivity, the thickness variation is typically between about 3-100% of the greatest thickness of the element.

In some embodiments the element is substantially coextensive with the semiconductor substrate and has between about 6,000-12,000 non-communicating channels made in an ionically resistive material. The element is located in close proximity of the semiconductor substrate. Typically, the substrate-facing surface of the element is separated from a plating face of the semiconductor substrate by a gap of about 10 millimeters or less during electroplating. In some embodiments, the apparatus further includes an inlet to the gap for introducing electrolyte flowing to the gap and an outlet to the gap for receiving electrolyte flowing through the gap, wherein the inlet and the outlet are positioned proximate azimuthally opposing perimeter locations of the plating face of the substrate, and wherein the inlet and outlet are adapted to generate cross-flow of electrolyte in the gap.

In another aspect, a method of electroplating metal on a semiconductor substrate comprising a plurality of recessed features, is provided. The method includes: (a) providing the substrate to a plating chamber configured to contain an electrolyte and an anode while electroplating metal onto the substrate, wherein the plating chamber includes: (i) a substrate holder holding the substrate such that a plating face of the substrate is separated from the anode during electroplating, and (ii) an ionically resistive ionically permeable element comprising a substantially planar substrate-facing surface and an opposing surface, wherein the element allows for flow of ionic current through the element towards the substrate during electroplating, and wherein the element comprises a region having varied local resistivity; and (b) electroplating a metal onto the substrate plating surface while cathodically biasing and rotating the semiconductor substrate.

In another aspect an electroplating apparatus is provided, wherein the apparatus includes: (a) a plating chamber configured to contain an electrolyte and an anode while electroplating metal onto a semiconductor substrate; (b) a substrate holder configured to hold the semiconductor substrate such that a plating face of the substrate is separated from the anode during electroplating; (c) an ionically resistive ionically permeable element, wherein the element allows for flow of an ionic current through the element towards the substrate during electroplating, and wherein the element comprises an azimuthally asymmetric ionically permeable region having an average resistivity that is different (e.g., greater) from the average resistivity of the rest of the element. The azimuthally asymmetric region can be located over an azimuthal fraction of the porous portion of the elements' peripheral region. The azimuthally asymmetric region can either have a smaller but constant porosity (or density of holes) than the rest of the element, or the region can have a porosity that gradually varies within the region but taken as a whole has a substantially lower porosity than the rest of the element. Such electroplating apparatus can be used for improving azimuthal non-uniformity. In one aspect, a method for electroplating is provided, wherein the method involves providing a substrate into the electroplating apparatus described above, and electroplating metal on the substrate while rotating the substrate relative to the ionically resistive ionically permeable element such that a selected azimuthally asymmetric region on the substrate dwells over the azimuthally asymmetric region of the element having different resistivity than the rest of the element for a different amount of time than another region of the substrate having the same area, same average radial position, and same average arc length but residing at a different azimuthal (angular) position.

The methods provided herein can be integrated into the processes that employ photolithographic patterning. In one aspect, the methods include any of the methods described above and further include applying photoresist to the wafer substrate; exposing the photoresist to light; patterning the photoresist and transferring the pattern to the wafer substrate; and selectively removing the photoresist from the wafer substrate. In another aspect of the invention, a system is provided, which includes any of the apparatuses described above and a stepper.

In some embodiments, an apparatus is provided, wherein the apparatus further includes a controller comprising program instructions and/or logic for performing any of the methods described herein. In one aspect a non-transitory computer machine-readable medium comprising program instructions is provided. The program instructions for control of an electroplating apparatus comprise code for performing any of the methods described above.

These and other features and advantages of the present invention will be described in more detail below with reference to the associated drawings.

DETAILED DESCRIPTION

Methods and apparatus for electroplating a metal on a substrate with improved uniformity, such as with improved radial uniformity, azimuthal uniformity, or both, are provided. The methods are particularly useful for through resist plating in WLP applications, but are not limited to these applications. The methods can also be used for electroplating in other processing schemes, such as in TSV processing and in fabrication of integrated circuits using damascene processing. The methods and apparatus employ an ionically resistive ionically permeable element having spatially tailored resistivity to address various uniformity challenges, such as terminal effect and non-uniform thickness of photoresist in through resist plating. The use of provided methods and apparatuses can result, in many cases, in good within wafer uniformity of 5% or less, wherein the uniformity value refers to a ratio of variation in thickness of electrodeposited metal layer ($thickness_{max}-thickness_{min}$) to twice the average thickness.

Embodiments are described generally where the substrate is a semiconductor wafer, however the invention is not so limited. The terms "semiconductor wafer" and "semiconductor substrate" are used herein interchangeably and refer to a workpiece that contains semiconductor material, such as silicon, anywhere within the workpiece. Typically the semiconductor material in the semiconductor substrate is covered with one or more layers of other materials (e.g., dielectric and conductive layers). The substrates used for electroplating include a conductive seed layer which is exposed at least at some positions on the surface of the substrate. The seed layer is typically a layer of metal, and may be, for example, a copper layer (including pure copper and its alloys), a nickel layer (including NiB and NiP layers), a ruthenium layer, etc. The substrate typically has a number of recessed features on its surface that are filled during the electroplating process. Examples of metals that can be electroplated using provided methods include, without limitation, copper, silver, tin, indium, chromium, a tin-lead composition, a tin-silver composition, nickel, cobalt, nickel and/or cobalt alloys with each other and with tungsten, a tin-copper composition, a tin-silver-copper composition, gold, palladium, and various alloys which include these metals and compositions.

Figure 1A:
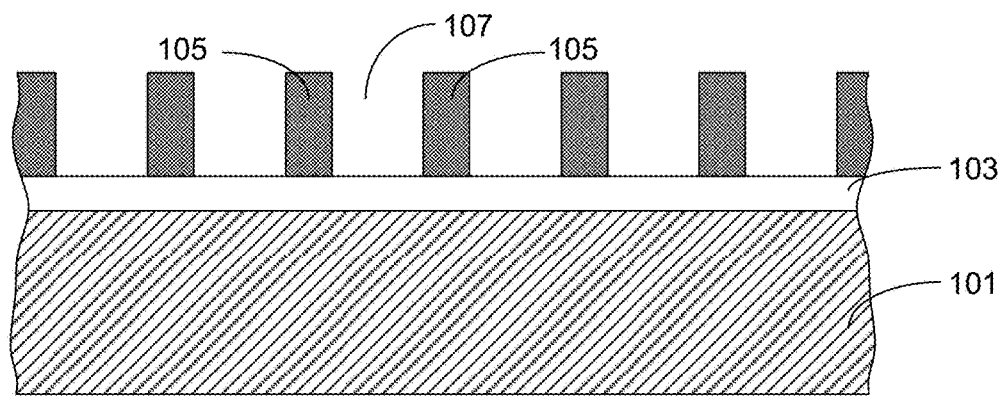
FIG. 1A is a schematic cross-sectional view of a substrate prior to through resist electroplating.

A schematic cross-sectional view of a substrate that undergoes WLP processing is shown in FIG. 1A. The substrate includes a layer of silicon 101, coated with a continuous copper seed layer 103. The seed layer 103 is covered with patterned photoresist 105 such that a plurality of recessed features 107 formed in the photoresist expose the seed layer 103 at their bottom portions. The portion of the seed layer that resides directly below the photoresist 105 is masked and does not come in contact with the electrolyte during electroplating. During electroplating, electrical contacts are made to the seed layer 103 around the edge of the substrate, and the substrate is cathodically biased. After the plating face of the substrate is brought in contact with the electrolyte, metal is only electrodeposited within the recessed features 107, where the seed layer is exposed, but not over the photoresist 105. After electroplating is completed, the photoresist 105 is removed, leaving pillars and lines of electrodeposited metal on the substrate. Terminal effect can be observed in through resist plating as increased thickness of electroplated metal at the edge of the substrate in comparison to the thickness in the central portion of the substrate. The terminal effect is more pronounced when thinner seed layers are used, because thinner and, consequently, more resistive seed layers lead to a greater voltage drop between the edge of the substrate (where the electrical contact is made) and the center of the substrate. One of conventional methods for mitigating the terminal effect is the introduction of a resistive element, such as of a porous plate that is coextensive with the substrate and that is located in close proximity of the substrate. Such plate introduces an additional resistance on the path of the ionic current from the anode towards the substrate, and promotes more uniform center-to-edge electroplating. Such plate having a uniform resistivity throughout its body (e.g., having same thickness and same porosity) is not always sufficient for adequately suppressing the terminal effect. In some cases, the seed layers may be so resistive and the edge-to-center voltage drop may be so great that a uniform plate of an unpractically high resistance would be needed to compensate for an extreme terminal effect. Through resist plating provides a particularly difficult situation, because in through resist plating the terminal effect does not subside during the course of electroplating since the sheet resistance of the seed layer does not decrease as more metal is deposited. This is because the thickness of the seed layer residing directly below photoresist remains constant during the course of electroplating. This situation is contrasted with electroplating on substrates having fully-exposed seed layer. When the entirety of the seed layer is exposed on the substrate, the sheet resistance of the seed layer diminishes as more metal is being electrodeposited during the course of electroplating, and, consequently, the terminal effect is reduced in the course of plating.

The embodiments provided herein make use of an ionically resistive ionically permeable element that has spatially tailored resistivity to counteract the terminal effect. Specifically, the element can have a greater local resistivity in the peripheral portion of the element than in the central portion of the element. Such element can be used in electroplating apparatuses for electrodepositing metal on both fully-exposed seed layer and on partially exposed seed layer (e.g., in through resist plating). The use of such element is particularly advantageous in through resist plating on copper seed layers having thicknesses of less than 1,000 Å, such as between about 200-950 Å, or on seed layers that are made of more resistive metals than copper. In addition, the use of such elements is particularly advantageous when electroplating is conducted in an electrolyte having particularly high conductivity (e.g. a conductivity of 50 mS/cm or more), as high-conductivity electrolytes exacerbate the terminal effect. When electroplating is conducted on seed layers having very high sheet resistance and/or with electrolytes having extremely high conductivity, the terminal effect can be so great that it may not be adequately compensated with the use of a conventional ionically permeable ionically resistive element with uniform local resistivity. Or, such element would be required to have an extremely high thickness and/or low porosity that would be impossible to manufacture or fit into the electroplating apparatus. In these situations, the provided element having varied local resistivity would be an effective solution to the terminal effect problem.

Another uniformity problem encountered in through resist electroplating is non-uniform electrodeposition of metal due to variation of thickness of photoresist on a substrate. It was observed that electroplating of metal occurs at a lower rate in recessed features surrounded by thicker photoresist. Therefore, variations in photoresist thickness directly affect the uniformity of electrodeposition. Thinner metal layers are electrodeposited in recessed features surrounded by relatively thicker photoresist. Photoresist is typically deposited on a substrate by a spin-on method, and it can be inadvertently deposited in the central portion of the wafer substrate at a greater thickness than near the edge of the wafer substrate. Such center-thick deposition of photoresist, although undesired, is typically reproducible from wafer to wafer, and therefore non-uniform electroplating due to center-thick photoresist may be reliably addressed by using an ionically permeable ionically resistive element having varied local resistivity that compensates for the variation in photoresist thickness. Thus, an element that has lower local resistivity in the center than at the edge can be used to improve plating uniformity during electroplating on wafers having center-thick photoresist layers.

Figure 1B:
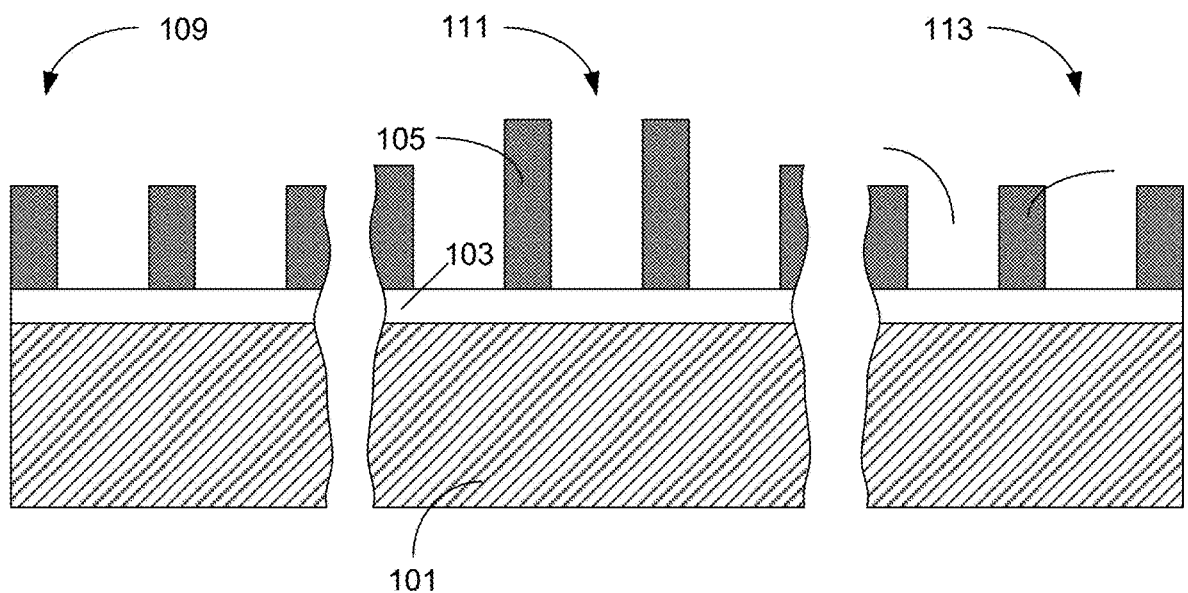
FIG. 1B is a schematic cross-sectional view of three portions of a substrate having center-thick layer of photoresist, prior to through resist electroplating.

FIG. 1B illustrates a schematic cross-sectional view of three portions of a substrate having center-thick photoresist layer. The portion 109 is the left edge of the substrate, the portion 111 is the central portion of the substrate and the portion 113 is the right edge of the substrate. It can be seen that left and right portions of the substrate have uniform thickness of the photoresist layer, while in the central portion of the substrate the photoresist is thicker than in the edge portions and its thickness is gradually increases towards the center of the substrate. This renders the recessed features in the center of the substrate deeper than the recessed features at the edge portions of the substrate and leads to thinner electrodeposited layers in the central portion of the substrate. For example if the photoresist in the center of the substrate is 40% thicker than at the edge, the electroplated layer was observed to be about 30% thinner in the center than at the edge with the use of a conventional ionically resistive ionically permeable element having uniform local resistivity. This type of non-uniformity can be minimized with the use of an appropriate ionically resistive ionically permeable element with spatially tailored resistivity. The resistivity of the element can be varied to match the variation in photoresist thickness on the wafer substrate, where the resistivity of the element is decreased directly below those regions of the substrate where the photoresist thickness is higher. Thus, in some embodiments, provided methods and apparatus are used on substrate having photoresist thickness variation of at least about 10%, such as at least about 20% of the total thickness of photoresist.

Generally, ionically resistive ionically permeable element with varied local resistivity can be used to address a variety of radial and azimuthal uniformity problems both in through resist plating and in other types of electroplating. Generally, the local resistivity of the element is spatially tailored in such a fashion as to provide higher local resistivity directly below the portion of the substrate, which would otherwise receive higher than needed ionic current (referring to plating face-down orientation). If the non-uniformity is azimuthal, and the substrate is rotated during electroplating, the rotation rate is adjusted such that the portion of the substrate that would otherwise receive higher than needed ionic current would dwell for a longer time over a region of the element that has higher resistivity than the rest of the element.

Ionically Resistive Ionically Permeable Element

The ionically resistive ionically permeable element (also referred to as "the element") is a component of an electroplating apparatus that provides an additional resistance on the path of ionic current towards the cathodically biased wafer substrate, and that allows for movement of ions through the element towards the substrate during electroplating.

In some embodiments the element is a porous plate, where the body of the plate is made of a resistive material, and the pores in the resistive material (which may be non-communicating channels or interconnected networks of pores) allow for movement of the ions through the plate towards the cathodically biased substrate. The element has a substrate-facing surface that is preferably planar and parallel to the substrate, and an opposing surface, which does not need to be planar. The element is positioned in close proximity of the substrate, but does not contact the substrate. Preferably the element is positioned within about 10 mm of the substrate, more preferably within about 5 mm of the substrate, such as within about 2-3 mm of the substrate during electroplating, where this gap refers to a distance between the plating face of the substrate and the substrate-facing surface of the element.

The thickness and porosity of the element may vary throughout the body of the element. The maximum thickness of the element ranges, in some implementations, from between about 10 to about 50 mm, and the minimal porosity is typically in the range of between about 1-5%, and is preferably less than about 3%. If the element is a plate having non-communicating drilled channels, the porosity is determined as a ratio of the area of channel openings on the substrate-facing surface of the element to the total area of the substrate-facing surface of the element. If the element has 3-dimensional networks of pores, the porosity is determined as a ratio of the volume of the pores to the total volume of the element.

In some embodiments the pores of the element are non-communicating channels (e.g., drilled holes in a dielectric plate that do not interconnect within the plate). These through-holes are distinct from 3-D porous networks, where the channels extend in three dimensions and form interconnecting pore structures. An example of an element with non-communicating through holes is a disc made of an ionically resistive material, such as polyethylene, polypropylene, polyvinylidene difluoride (PVDF), polytetrafluoroethylene, polysulphone, polyvinyl chloride (PVC), polycarbonate, and the like, having between about 6,000-12,000 1-D through-holes. In some implementations the element may further serve an electrolyte flow-shaping function, and may allow for large volume of electrolyte to pass through the channels of its body and provide an impinging flow of electrolyte at the wafer surface. The diameters of the channels should not be larger than the distance between the substrate and the substrate-facing surface of the element, and typically the diameters should not exceed 5 mm. Typically, the diameters of the channels are in a range of between about 0.5-1 mm. For example the channels may have diameters of 0.508 mm or 0.66 mm. The channels may be directed at a 90 degree angle to the substrate-facing surface of the element, or at a different angle of incline.

In other embodiments the pores are three-dimensional networks interconnected within the body of the element and the element is made of a porous dielectric material such as porous silicon carbide, porous glass, and the like.

Figure 2A:
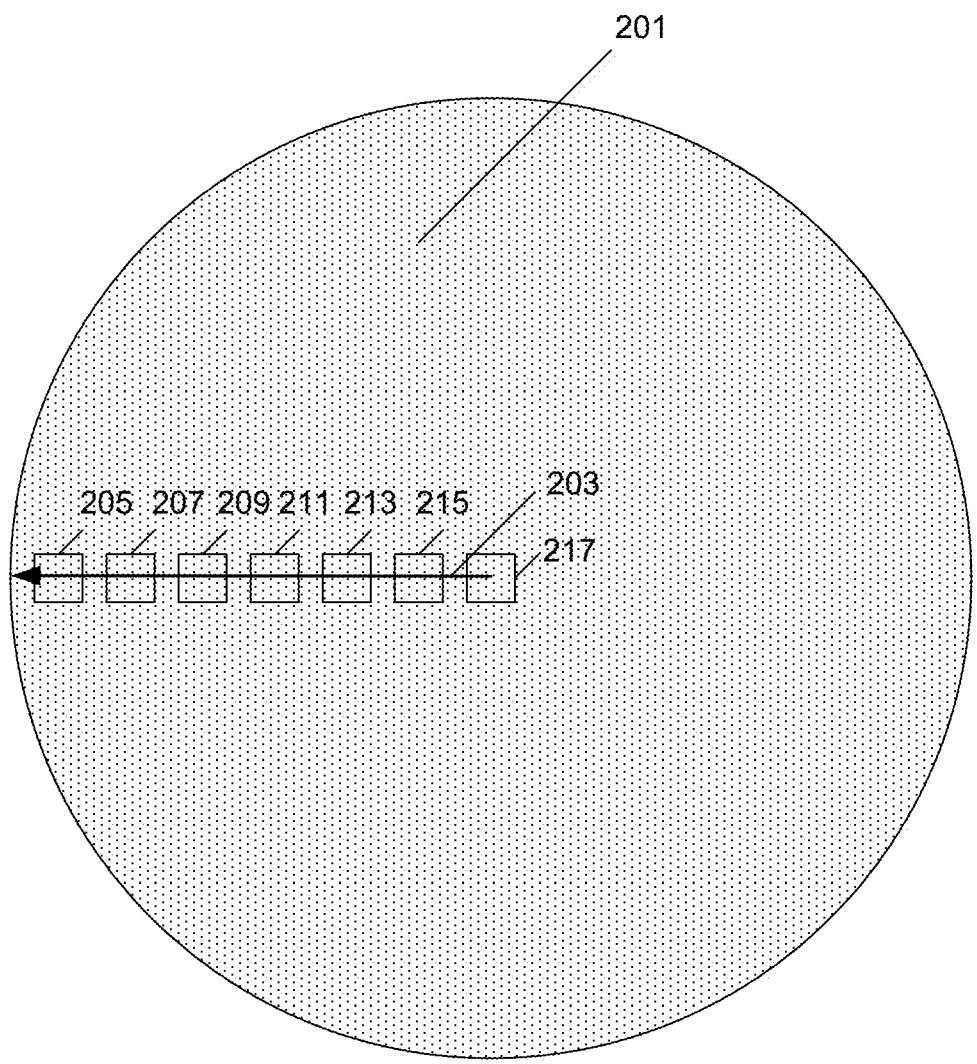
FIG. 2A is a schematic top view of an ionically resistive ionically permeable element that illustrates the definition of locally varied resistivity.

An ionically resistive ionically permeable element having varied local resistivity is illustrated in FIG. 2A. An element having varied local resistivity is defined as an element having at least two ionically permeable standard regions that have different local resistivities. It is noted that regions that are not ionically permeable (e.g., regions covered with shields or having only blocked holes) are not to be used in the determination of local resistivities of the element and are not considered to be a part of the element, as provided herein. The resistivity refers to resistivity for the ionic current traveling through the element towards the cathodic substrate, provided that all pores of the element are filled with the same electrolyte. A standard region, as used herein, refers to a volume portion of the element obtained by taking a standard area on the substrate-facing surface of the element and projecting that standard area through the element in the direction that is perpendicular to the plane of the substrate-facing surface and terminating at the lower (opposing) surface of the element. The standard area, as defined herein, is equal to 0.35% of the area of the substrate-facing surface of the element. For example, if the substrate-facing surface is a circle with a diameter of 30 cm, the area of the substrate-facing surface is 706.5 cm$^2$, and the standard area for local resistivity determination is about 2.5 cm$^2$. Local porosity is determined using a similar approach, and is defined as a porosity in a volume portion of the element obtained by taking the standard area on the substrate-facing surface and projecting that standard area through the element in a direction that is perpendicular to the substrate-facing surface and terminating at the lower (opposing) surface of the element. In the case where the porosity is produced by discrete vertical holes through the element, small changes in the exact location of the standard area will result in small changes (typically less than 3%) depending on whether the area captures the maximum number vs. a minimum number of holes. Some embodiments of provided elements have varied local porosity, i.e., at least two different standard regions having different porosities.

FIG. 2A shows a schematic top view of an element 201, which illustrates the substrate-facing surface of the element and a plurality of exemplary standard areas 205, 207, 209, 211, 213, 215, 217 (the mentally cut out volume portion below the substrate-facing surface of the element is not shown). For example, the element has varied local resistivity if the local resistivity in the regions directly below any of two standard areas is different. For example if the resistivities in the region below the standard area 205 and below standard area 217, are different, the element has varied local resistivity. The standard areas for determination of local resistivity should be non-overlapping. The difference should be due to true non-uniformity of the element (e.g., thickness variation and/or porosity variation in the element), rather than due to fluctuations from the placement of standard region over minimum and maximum number of channels in a uniform element.

In some embodiments the local resistivity in the element changes gradually. Gradual change is defined as the presence of at least four local resistivity values that increase or decrease along any vector on the substrate-facing surface of the element. In some embodiments, the vector is the radius of the substrate facing surface, as radius 203, shown in FIG. 2A. In some embodiments, the local resistivity is gradually increased from the center of the element towards the edge of the element. An example of such gradual increase in resistivity is an embodiment in which the local resistivity in standard region below area 205 is greater than in the standard region below 207, which is in turn greater than in the standard region below 209, which is in turn greater than in the standard region below 211. Although only one radius is shown in FIG. 2A, in one of the embodiments the local resistivity increases from the center towards the edge of the element radially over the entirety of the element. This embodiment is particularly well suited for addressing the terminal effect during electroplating.

Figure 2B:
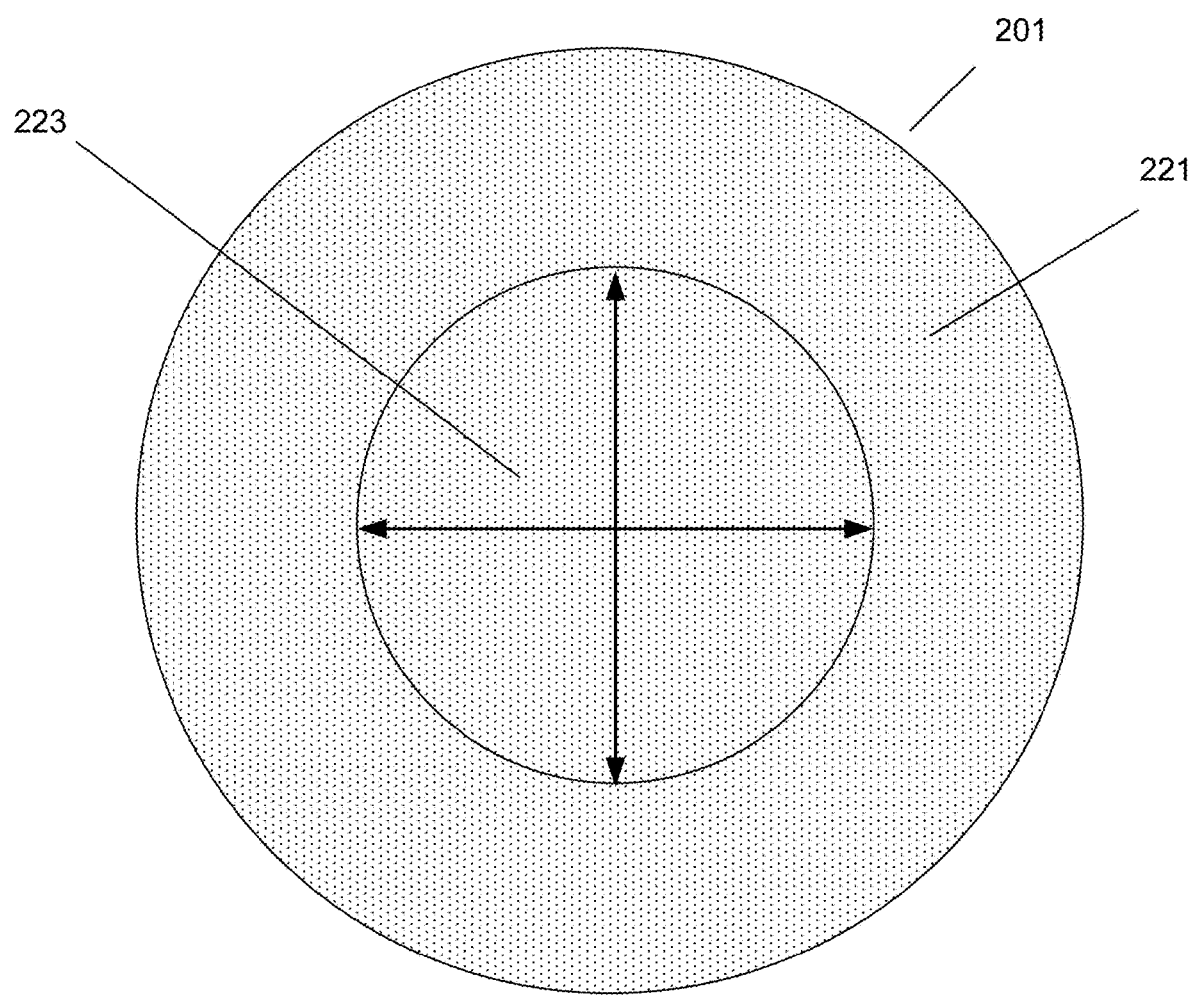
FIG. 2B is a schematic top view of an ionically resistive ionically permeable element in accordance with an embodiment provided herein.

Another embodiment of an element having varied local resistivity is illustrated in FIG. 2B. Schematic top view of the element is shown. In this embodiment the element 201 includes an outer portion 221 having constant resistivity, and central portion 223, where the local resistivity is varied. In the depicted embodiment the resistivity is gradually increased in radial direction from the center of the element towards the interface with the portion of constant resistivity 221, as shown by the arrows. Only four arrows are shown, but it is understood that in this embodiment the resistivity is varied in the described radial direction over the entirety of the central portion 223. This embodiment is well-suited for addressing radial non-uniformity arising due to center-thick layers of photoresist on the processed substrate, as it was described with reference to FIG. 1B.

The local resistivity of the element can be varied using a number of approaches. These approaches include varying the thickness and/or porosity of the element.

For example, when the element is a plate having a plurality of non-communicating channels, local resistivity is determined by equation (1):

$$R=L/(\rho AK)=4L/(\pi \rho DK) \qquad (1),$$

wherein R is local resistivity, L is length of the channel, A is cross-sectional area of a channel, ρ is the density of channels, D is the diameter of channels, and K is conductivity of electrolyte within the channels.

When the channels are perpendicular to the substrate-facing surface of the element, the length of the channels at each location of the element is equal to the thickness of the element at this location (the distance between the substrate-facing surface of element and the opposite surface of the element). Therefore, the local resistivity in the element can be varied by varying the thickness of the element, while maintaining the local porosities at a constant value throughout the element.

Figure 2C:
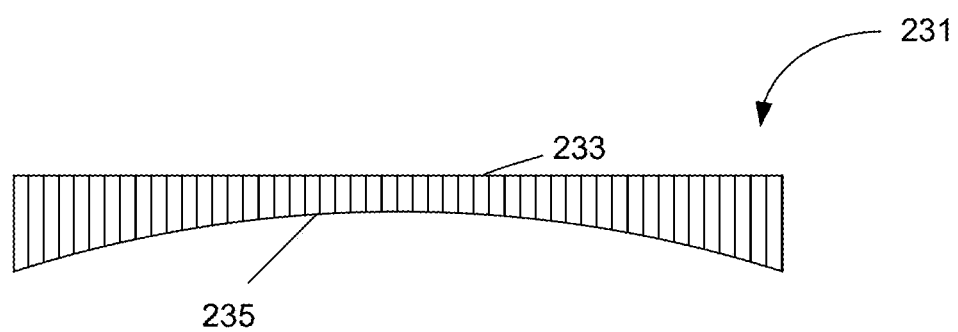
FIG. 2C is a schematic cross-sectional view of an ionically resistive ionically permeable element having variable thickness in accordance with an embodiment provided herein.

One example of an element having varied thickness and varied local resistivity is shown in FIG. 2C. This illustration presents a schematic cross-sectional view of the element 231 having a planar substrate-facing surface 233, and a convex opposing surface 235. The thickness of the element in this example gradually decreases in the radial direction from the edge to the center of the element. The local resistivity of the element similarly decreases in a gradual fashion along the radii of the element from the edge of the element towards the center of the element. A plurality of uniformly distributed channels having equal diameters and directed at 90 degree angle to the substrate-facing surface of the element connect the convex surface 235 with the substrate-facing surface 233. The surface 235 in some embodiments follows a second order polynomial function (when viewed in radial cross-section). In other embodiments the surface 235 may follow a different function, such as a linear function, or the local resistivity may be decreased towards the center in a stepwise fashion. Typically the variation of the thickness of the element is between about 3-100%, such as between about 3-10% of the greatest thickness of the element, more preferably between about 7-10% of the greatest thickness of the element. Often, the thickness of the element at the edge is 0.54-1.8 mm greater, such as 1.3-1.8 mm greater than the thickness of the element at the center. For example the maximum thickness at the edge can be in the range of between about 15-18 mm, while the minimum thickness at the center can be in the range of between about 16.5-17.5 mm. In one specific example the thickness of the element at the edge is about 18 mm and at the center is about 16.7 mm.

Figure 2D:
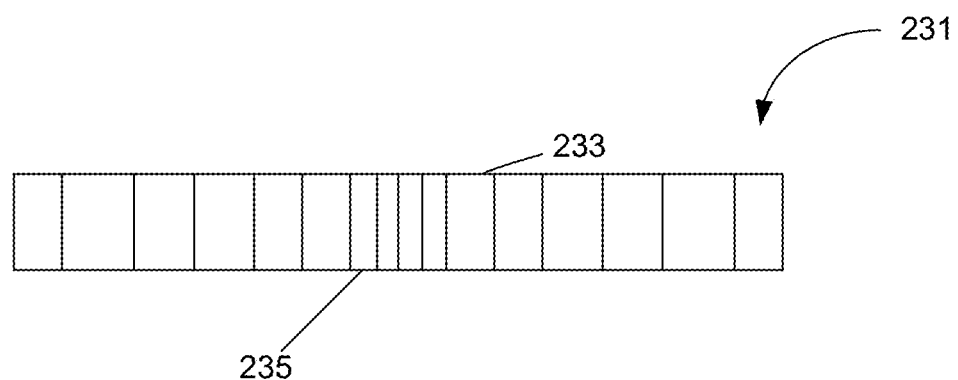
FIG. 2D is a schematic cross-sectional view of an ionically resistive ionically permeable element having variable density of channels in accordance with an embodiment provided herein.

Another example of an element having varied local resistivity is shown in FIG. 2D. In this example the element has a uniform thickness, but the density of the channels in the element is locally varied. In the depicted cross-sectional view of the element 231 the substrate-facing surface 233 and the opposing surface 235 are parallel and are connected by a plurality of non-communicating channels that are perpendicular to both surfaces. The local densities of the channels are varied in this example, such that the local densities of the channels gradually decrease in the radial direction towards the edge of the element. Thus, local density of the channels near the edge of the element is smaller than the local density of the channels near the center of the element. Thus, the local resistivities in this element gradually decrease in a radial direction from the edge portion of the element towards the center of the element. The local density of channels is determined as the density of channels in a standard region that was previously defined. In some embodiments the local density of channels at the edge of the wafer is between about 10-60 channels per region and is between about 40-100 channels per region at the center of the wafer (where the standard area of the region corresponds to 0.35% of the total area of the substrate-facing surface of the element, e.g., to 2.5 cm² region on an element having an area of 706.5 cm²). In a specific example, the element has a channel density of about 10 channels per standard region at the edge, and about 40 channels per standard region in the center. In another specific example, the element has a channel density of about 15 channels per standard region at the edge, and about 60 channels per standard region in the center.

Figure 2E:
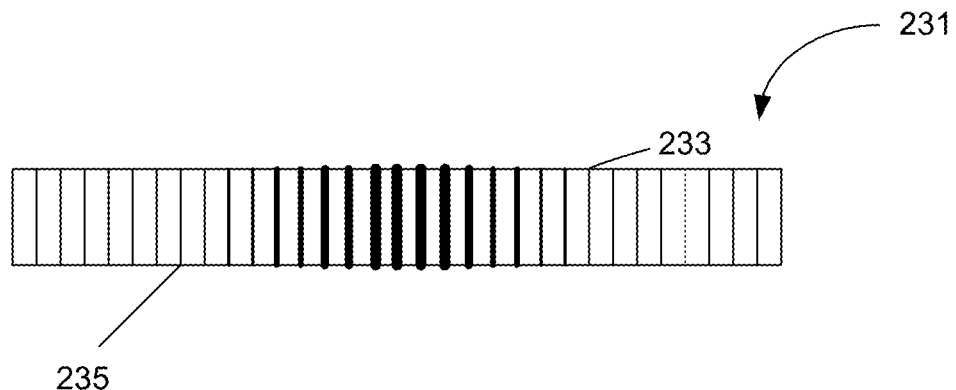
FIG. 2E is a schematic cross-sectional view of an ionically resistive ionically permeable element having variable size of channels in accordance with an embodiment provided herein.

The local resistivity, as it can be seen from equation (1) can also be modulated by modulating the size of the channels (or diameter of the channels when channels are cylindrically shaped). In the illustration shown in FIG. 2E, the channels are uniformly distributed between parallel surfaces 233 and 235 of the element 231, but the diameters of the channels are varied in correlation with their location. In this example the diameters of the channels gradually increase in a radial direction from the edge portion of the element towards the center of the element. Thereby gradual decrease of local resistivity in the radial direction is achieved. In some embodiments, the diameters of the channels increase by about 4% to 8% from the edge to the center of the element. For example the diameters can increase by 0.01 mm to 0.04 mm from the edge to the center of the element. In one implementation the diameters of the channels at the edge of the element are 0.6 mm, and in the center of the element about 0.625 mm.

Figure 2F:
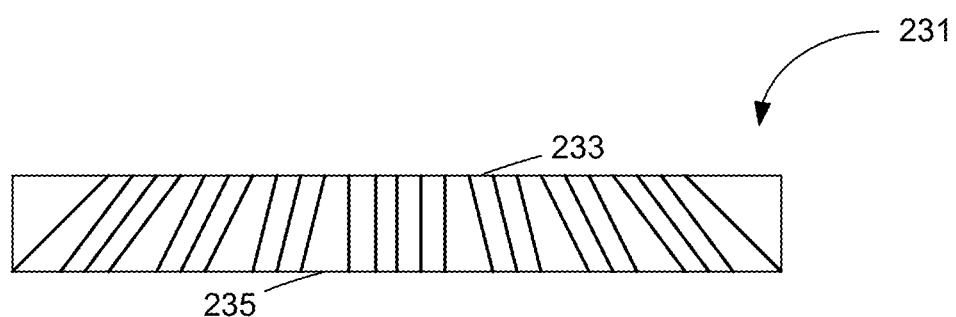
FIG. 2F is a schematic cross-sectional view of an ionically resistive ionically permeable element having channels with varied incline angles in accordance with an embodiment provided herein.

While in many embodiments the element includes only channels that are perpendicular to the substrate-facing surface of the element, in some embodiments it may be advantageous to use channels that have an angle of incline that is different from 90 degrees. The angle of incline is defined herein as an acute angle formed between the channel and the plane of the substrate-facing surface of the element. In some embodiments this angle is locally varied typically in the range of between about 35-90 degrees in order to achieve variation in local resistivity. The locations where channels are angled at smaller angles have relatively longer channels and consequently have greater resistivity. An example of an element having varied incline angles for the channels is shown in FIG. 2F. In this example the element 231 has uniform thickness but the channels connecting parallel surfaces 233 and 235 exhibit a gradual variation in the incline angle, such that the incline angle gradually increases in a radial direction from the edge portion of the element towards the central portion of the element (where the incline angle in the depicted example is 90 degrees).

The variation in local resistivity can also be achieved by variations of local porosity, wherein local porosity can be varied by varying the diameters of the channels, the density of the channels, or the combination of the two. Further, if the element contains networks of three-dimensional pores, the local porosity is varied by varying the volume occupied by these pores at various locations of the element. In some embodiments, the local porosity is increased in a radial direction from the edge of the element towards the center of the element. In some embodiments, the porosity may increase by about 10-200%, such as by 50-150%. For example, in some embodiments the local porosity at the edge of the element is about 4%, and is about 8% at the center of the element. The change may follow a variety of functions, including a linear function, and a second order polynomial function.

Figure 2G:
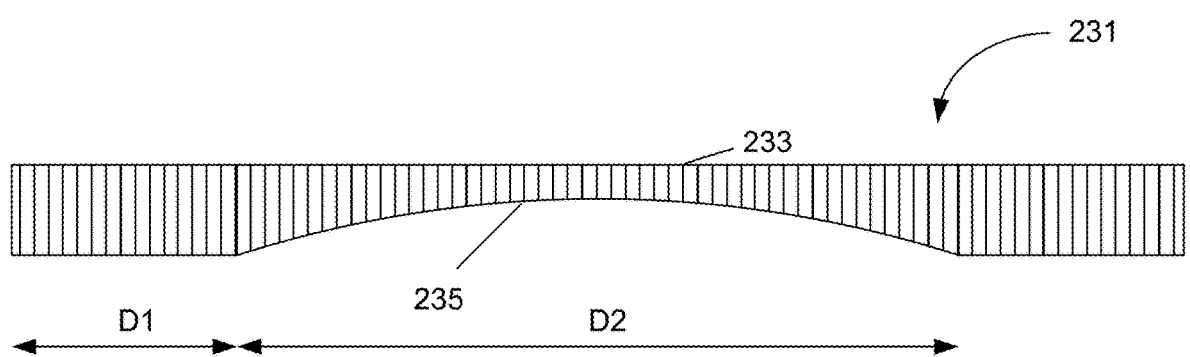
FIG. 2G is a schematic cross-sectional view of an ionically resistive ionically permeable element having varied local resistivity in accordance with an embodiment provided herein.

The principles illustrated above can be applied to any type of variation of local resistivity. For example local resistivity can be varied (e.g., by thickness variation, porosity variation or both) in a selected region of the element, rather than across the entire element as was shown in FIGS. 2C-2F. FIG. 2G illustrates an element 231 that includes a region of constant thickness having width D1 surrounding a region of varied thickness having a diameter D2. In this example the thickness is gradually decreased in a radial direction from the interface with the region of constant thickness towards the center of the element. This example illustrates one type of an element that can be used to improve electroplating uniformity when plating on substrates having center-thick photoresist layers. The specific parameters for the amount of thickness variation, and for the width of the zone of constant thickness, depend on the geometry of the non-uniformity on the wafer. Typically, when the wafer contains a region of constant-thickness photoresist surrounding a region of photoresist with variable thickness, the element (which resides directly below the wafer when plating is performed in face-down orientation) should have a thickness that is tailored to this profile. Specifically the region of the element residing directly below the region of the wafer with constant photoresist thickness, should have constant thickness, while the region of the element residing directly below the region of the wafer with variable photoresist thickness, should have variable thickness, wherein the thickness of the element should decrease as the thickness of photoresist is increased. Typically the region of the element having constant thickness in this embodiment is an annular region having a width of about 60-120 mm, and the inner region having variable thickness has a diameter of about 30-60 mm. In one embodiment, the thickness of the element in the region of constant thickness is about 14 mm, and in the center of the element is about 7 mm.

It should be noted that the resistivity of the element, its thickness and porosity profile should be tailored to the type of wafer that is being processed. Thus, for example, an element that provides uniform plating on a 500 Å seed layer may provide non-uniform plating on a 300 Å seed layer. Similarly, an element that is tailored for uniform plating on center-thick photoresist layer can provide non-uniform plating on a uniform photoresist layer. The principles discussed herein (such as providing the element with more resistivity, and with more center-to-edge local resistivity variation for thinner seed layers, and providing more local resistivity for regions of the element directly below thicker photoresist) can be used to manufacture a variety of elements tailored for different types of substrates.

Apparatus

The ionically resistive ionically permeable element having varied local resistivity can be used in a variety of electroplating apparatuses, including wafer face-up and wafer face-down apparatuses. An example of a wafer face-down apparatus that can incorporate the provided element is Sabre 3D™ electroplating system available from Lam Research Corporation of Fremont, Calif. Generally, the electroplating apparatus includes an electroplating chamber configured to contain an electrolyte and an anode while electroplating metal onto a semiconductor substrate; a substrate holder configured to hold the semiconductor substrate such that a plating face of the substrate is separated from the anode during electroplating; and an ionically resistive ionically permeable element having a region of varied local resistivity, which was described in the previous section. The region of varied local resistivity can be coextensive with the element, or this region can be only a localized portion of the element.

Figure 3:
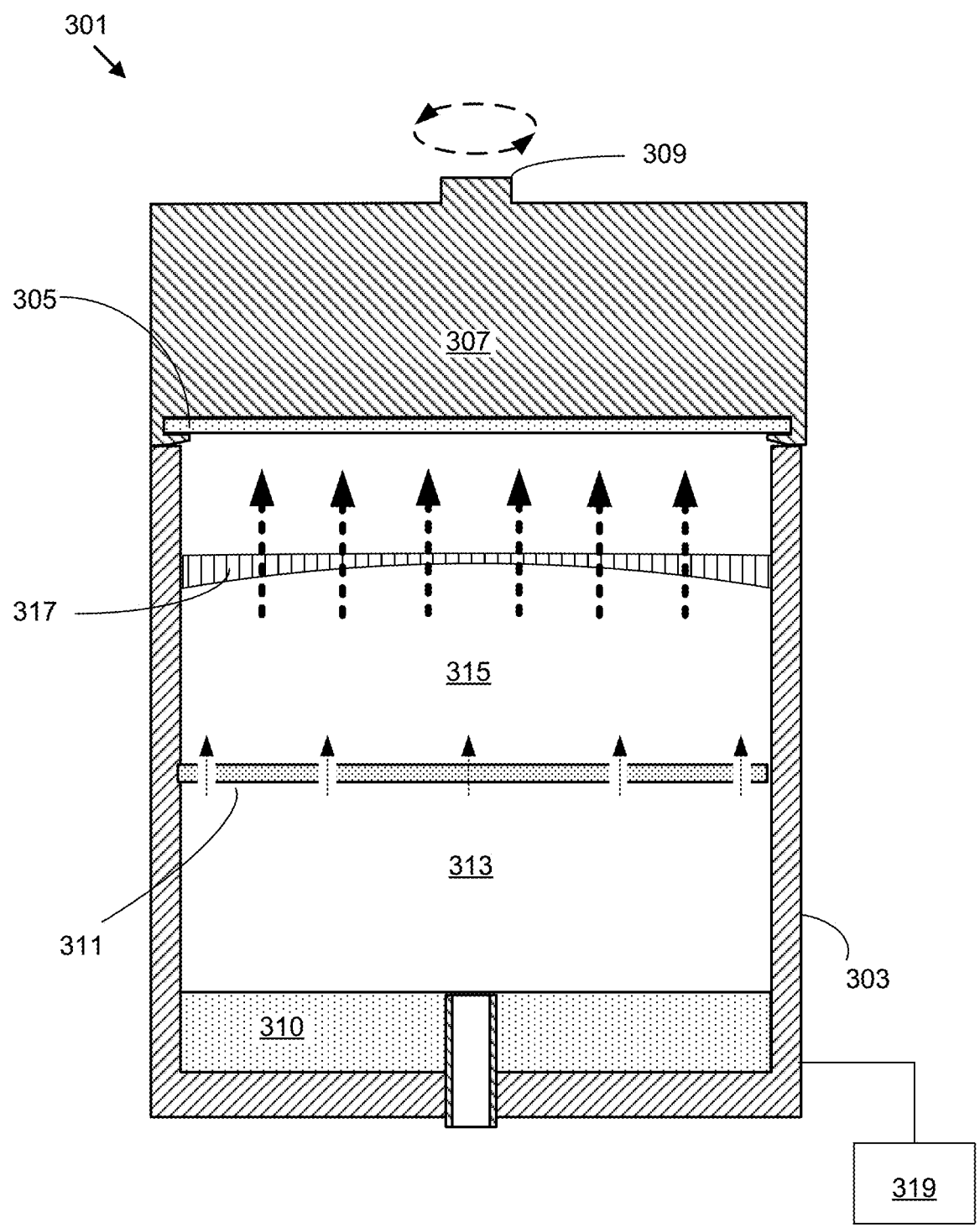
FIG. 3 is a schematic cross-sectional view of an electroplating apparatus in accordance with an embodiment provided herein.

One example of an apparatus, where the ionically resistive ionically permeable element has radially varied thickness throughout the element is presented in FIG. 3. A diagrammatical cross-sectional view of an electroplating apparatus 301 is shown. The plating vessel 303 contains the plating solution (electrolyte), which typically includes a source of metal ions and an acid. A wafer 305 is immersed into the plating solution in a face-down orientation and is held by a "clamshell" holding fixture 307, mounted on a rotatable spindle 309, which allows bidirectional rotation of clamshell 307 together with the wafer 305. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are herein incorporated by reference. An anode 310 (which may be an inert or a consumable anode) is disposed below the wafer within the plating bath 303 and is separated from the wafer region by a membrane 311, preferably an ion selective membrane. The region 313 below the anodic membrane is often referred to as an "anode chamber" or "anolyte compartment" and electrolyte within this chamber as "anolyte". The region 315 above the membrane 311 is referred to as a "catholyte compartment". The ion-selective anode membrane 311 allows ionic communication between the anodic and cathodic regions of the plating cell, while preventing the particles generated at the anode from entering the proximity of the wafer and contaminating it and/or undesirable chemical species, present in the catholyte electrolyte, from coming into contact with the anode 313. An ionically resistive ionically permeable element having varied local resistivity 317 resides in close proximity of the wafer 305, is coextensive with the wafer, and is separated from the wafer by an electrolyte-filled gap of 10 mm or less.

The plating solution is continuously provided to plating bath 303 by a pump (not shown). In some embodiments, the plating solution flows upwards through the membrane 311 and through the ionically resistive ionically permeable element having varied local resistivity 317 located in close proximity of the wafer. In other embodiments, such as when the membrane 311 is largely impermeable to flow of the plating fluid (e.g. a nanoporous media such as a cationic membrane), the plating fluid enters the plating chamber between the membrane 311 and the element 317, for example at the chamber periphery, and then flows through the element. In this case, plating fluid within the anode chamber may be circulated and the pressure can be regulated separately from the cathode chamber. Such separate regulation is described, for example, in the U.S. Pat. No. 8,603,305, issued Dec. 10, 2013 and in the U.S. Pat. No. 6,527,920, issued Mar. 4, 2003, both of which are herein incorporated by reference in their entireties.

In the depicted example the element with varied resistivity 317 has varied thickness, wherein its thickness is gradually reduced in radial direction from the edge of the element towards the center of the element. Other types of the elements with varied local resistivities (such as elements with varied local porosity) can also be used. The arrows schematically show the plating current in the illustrated apparatus. The current originating from the anode 310 is directed upward, passes through the membrane 311 separating anolyte and catholyte compartments and through the element 317. In the depicted example the ionic current meets with lower resistance in the central portion of the plating chamber than at the edge of the plating chamber because the element 317 is thinner at the center. This mitigates the terminal effect and improves plating uniformity.

A DC power supply (not shown) is electrically connected with the wafer 305 and the anode 310, and is configured to negatively bias the wafer 305 and to positively bias the anode 310. The apparatus further includes a controller 319, which allows for modulation of current and/or potential provided to the elements of electroplating cell. The controller may include program instructions specifying current and voltage levels that need to be applied to various elements of the plating cell, as well as times at which these levels need to be changed. The controller can also include program instructions specifying the rates of electrolyte delivery and electrolyte composition, and the rates at which the substrate is rotated. Generally, the controller is electrically connected with the components of the plating apparatus, and can include program instructions or logic specifying any of the parameters of provided electroplating methods.

Additional Features of Provided Apparatus

Figure 4A:
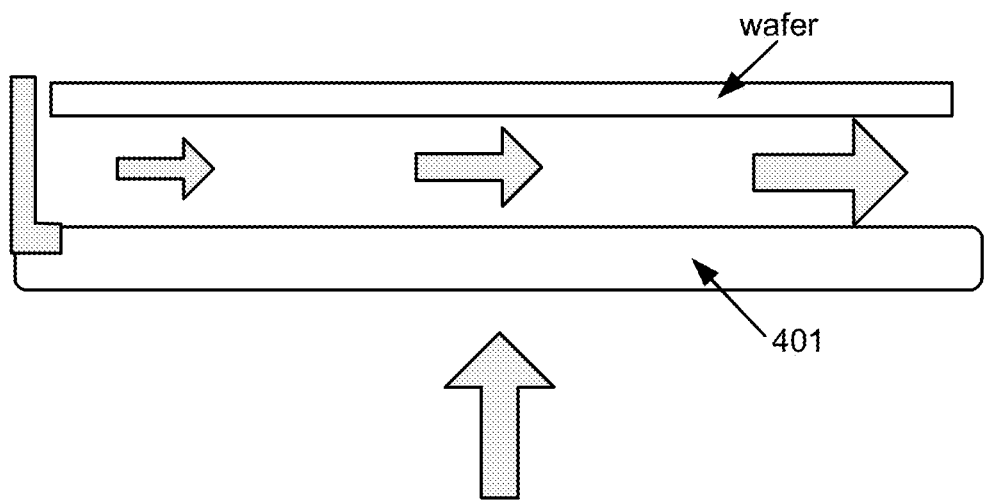
FIG. 4A is a schematic cross-sectional view of a part of an electroplating apparatus in accordance with an embodiment provided herein, illustrating lateral flow of electrolyte at the wafer surface in accordance with an embodiment provided herein.
Figure 4B:
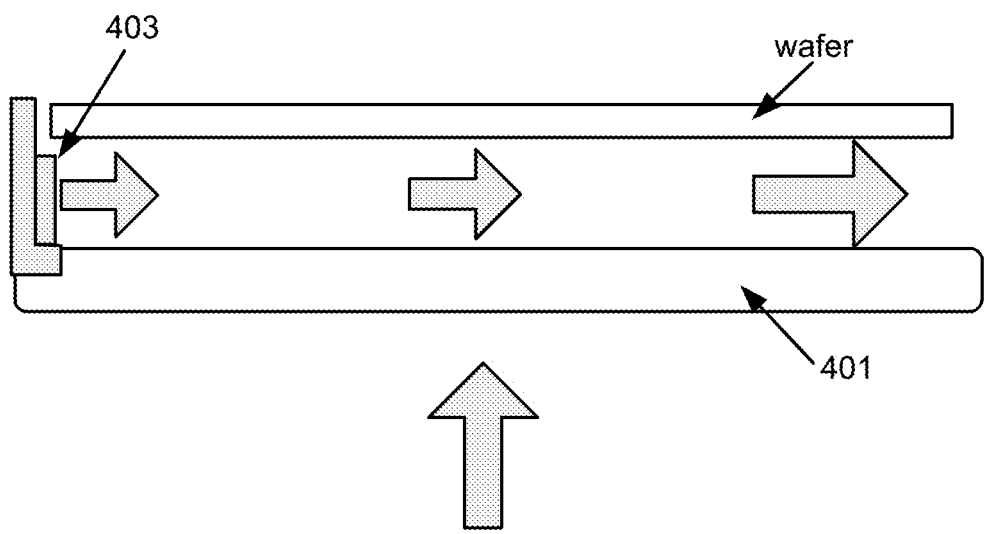
FIG. 4B is a schematic cross-sectional view of a part of an electroplating apparatus in accordance with an embodiment provided herein, illustrating lateral flow of electrolyte at the wafer surface in accordance with another embodiment provided herein.

In some embodiments it is preferable to equip the apparatus having the ionically resistive ionically permeable element with a manifold that provides for a cross-flow of electrolyte near the surface of the wafer. Such manifold is particularly advantageous for electroplating in relatively large recessed features, such as WLP or TSV features. In these embodiments the apparatus may include a flow shaping device positioned between the element and the wafer, where the flow-shaping device provides for a cross-flow substantially parallel to the surface of the wafer substrate. For example the flow shaping device may be an omega-shaped plate that directs the cross-flow towards an opening in the omega-shaped plate. A cross-sectional depiction of such configuration is illustrated in FIG. 4A, which shows that the electrolyte enters the ionically resistive ionically permeable element 401 in a direction that is substantially perpendicular to the plating surface of the wafer, and that after exiting the element 401 a cross-flow in a direction that is substantially parallel to the plating surface of the wafer is induced, because the flow of electrolyte is restricted by a wall. A lateral flow of electrolyte through the center of the substrate in a direction that is substantially parallel to the surface of the substrate is achieved. In some embodiments, the cross-flow is further induced by injecting catholyte in a direction that is substantially parallel to the surface of the substrate at a desired angular position (e.g., substantially across from the opening). In this embodiment the apparatus includes an inlet to the gap between the substrate and the element for introducing electrolyte flowing to the gap and an outlet to the gap for receiving electrolyte flowing through the gap, wherein the inlet and the outlet are positioned proximate azimuthally opposing perimeter locations of the plating face of the substrate, and wherein the inlet and outlet are adapted to generate cross-flow of electrolyte in the gap. This embodiment is illustrated in FIG. 4B, which illustrates an injection manifold 403 which injects the catholyte laterally into the narrow gap between the ionically resistive ionically permeable element 401 and the substrate. Cross-flow manifolds and flow-shaping elements for providing cross-flow of electrolyte at the wafer surface that can be used in combination with the embodiments provided herein are described in detail in the U.S. Pat. No. 8,795,480 by Mayer et al., titled "Control of Electrolyte Hydrodynamics for Efficient Mass Transfer Control during Electroplating" issued on Aug. 5, 2014, and in US patent Publication No. 2013/0313123 by Abraham et al., titled "Cross Flow Manifold for Electroplating Apparatus", published on Nov. 28, 2013, which are herein incorporated by reference in their entireties. While the portion of the element 401 shown in FIGS. 4A and 4B is shown to have constant thickness in the illustrated example, it is understood that this element has varied local resistivity (e.g., via variation of local porosity) as described herein. It is also noted that in the embodiments, that employ cross-flow of electrolyte at the surface of the wafer (either by direct injection of electrolyte in a lateral direction, or by providing an appropriate flow-shaping device), it is particularly important to employ an ionically resistive ionically permeable element having planar substrate-facing surface that is parallel to the plating surface of the substrate, because such surface allows for unimpeded lateral flow at the surface of the wafer. While in general, ionically resistive ionically permeable elements having curved substrate-facing surface may be used, it was determined that elements having planar substrate-facing surface are preferable as the lateral flow is optimal between two planar surfaces (the surface of the wafer and the substrate-facing surface of the element.

The electroplating apparatus may further include one or more additional components that may help tune the uniformity of electrodeposition. For example, in some embodiments the apparatus further includes a thieving cathode positioned near the periphery of the substrate and configured to divert plating current from the near-edge portion of the substrate. In some embodiments the apparatus may further include one or more dielectric shields on the path of the plating current to restrict the current in the shielded area. These optional components are not shown in the illustration of the apparatus to preserve clarity.

Methods

Figure 5:
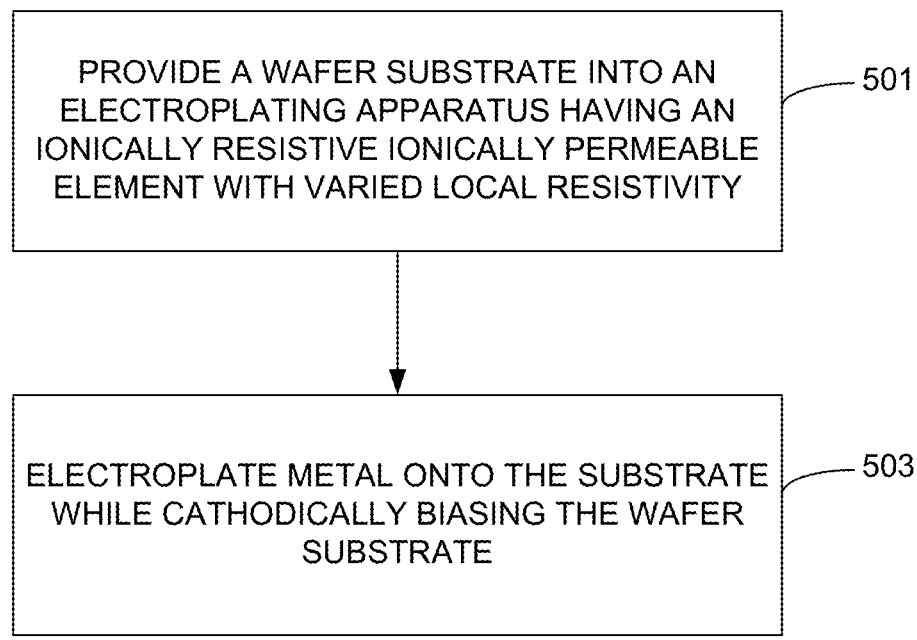
FIG. 5 is a process flow diagram for an electroplating method in accordance with an embodiment provided herein.

Methods for electrodepositing metals with improved uniformity are provided. The process flow diagram presented in FIG. 5 illustrates a suitable electroplating method. In operation 501, a wafer substrate is provided into an electroplating apparatus having an ionically resistive ionically permeable element having varied local resistivity. For example, a substrate configured for through resist electroplating and having a plurality of recessed features such as a substrate shown in FIG. 1A or FIG. 1B, may be used. The plating surface of the substrate is brought in contact with the electrolyte and the substrate is positioned such that the substrate-facing surface of the ionically resistive ionically permeable element resides in close proximity of the plating surface of the substrate. The substrate is electrically connected to a power supply, typically using a plurality of electrical contacts located at the periphery of the substrate. In operation 503, the substrate is biased cathodically, and metal is electroplated onto the substrate. The substrate is typically rotated during electroplating at a rotation rate of between about 2 150 rpm. In some embodiments, the electrolyte is continuously pumped into the electroplating chamber during the course of electroplating. A layer of metal, e.g., copper is deposited on the substrate. After electroplating is completed the substrate is sent for subsequent processing. For example, in through-resist processing, the next step after electroplating is typically removal of photoresist using known photoresist stripping methods.

Correction of Azimuthal Non-Uniformity

In some embodiments an ionically resistive ionically permeable element with varied local resistivity is used to improve azimuthal uniformity during electroplating. In some semiconductor substrates the distribution of recessed features is azimuthally non-uniform, which may lead to azimuthal non-uniformity of the electroplated layer. Other substrates may be azimuthally asymmetric due to a presence of a notch at the edge of the substrate. Such notch can lead to azimuthally non-uniform distribution of ionic current over the substrate, with current crowding being present near the notch.

Figure 6:
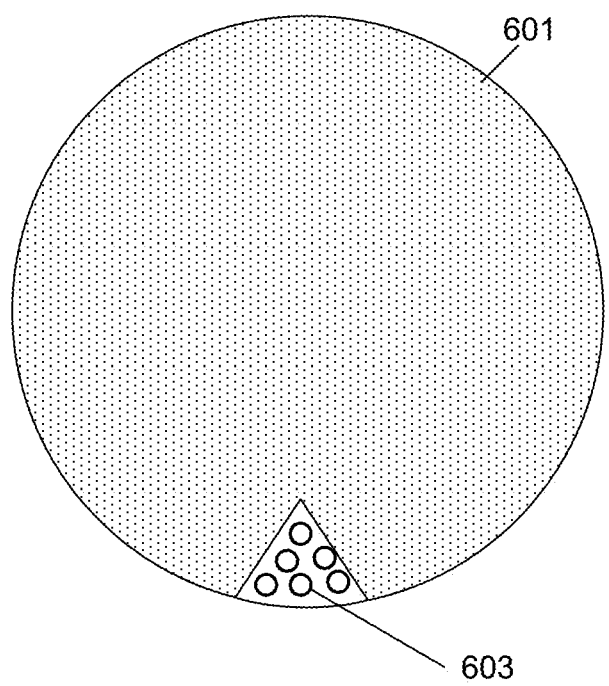
FIG. 6 is a schematic top view of an ionically resistive ionically permeable element having an azimuthally asymmetric region of dissimilar resistivity, in accordance with an embodiment provided herein.
Figure 7:
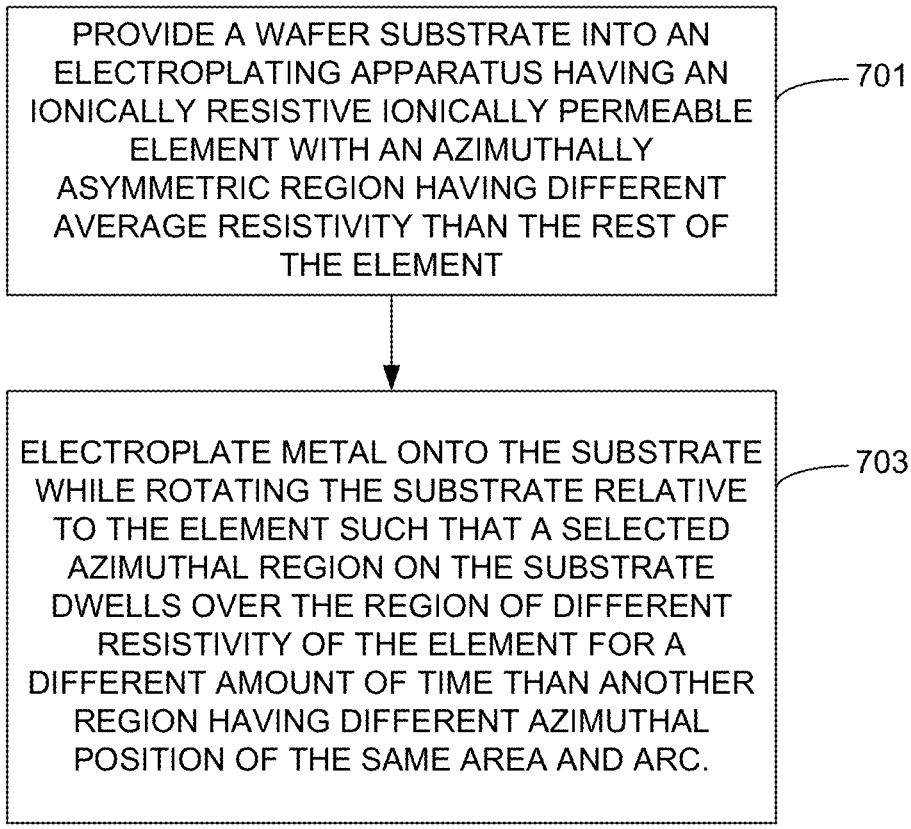
FIG. 7 is a process flow diagram for an electroplating method in accordance with an embodiment provided herein.

In some embodiments azimuthal non-uniformity is corrected using an ionically resistive ionically permeable element having an azimuthally asymmetric region that has an average resistivity that is different from the average resistivity of the rest of the element. The area of this region (referring to the area of the substrate-facing surface) should be at least 0.35% of the total area of the substrate-facing surface of the element. An example of such element is illustrated in FIG. 6 which shows a schematic top view of an ionically resistive ionically permeable element 601 that has an azimuthally asymmetric region 603 that has an average resistivity that is different from the average resistivity of the rest of the element. For example, region 603 may have a greater thickness or may be less porous than the rest of the element, but is still permeable to ionic current. Such element can be in any type of an electroplating apparatus described herein. FIG. 7 shows a process flow diagram for an electroplating method that uses such azimuthally asymmetric element. In operation 701 a substrate is provided into an electroplating apparatus having an ionically resistive ionically permeable element that has an azimuthally asymmetric ionically permeable region that has an average resistivity that is different from the average resistivity of the rest of the element. Next, in operation 703 metal is electroplated onto the substrate while the substrate is rotated relative to the element such that a selected azimuthally asymmetric region of the substrate dwells over the azimuthally asymmetric region of different resistivity of the element for a different amount of time than a different region of the substrate having the same radial position and the same arc length but residing at a different azimuthal position. For example, the wafer substrate may be rotated at a first speed and may be slowed down to a second, lower speed, when the selected azimuthally asymmetric region on the wafer substrate passes over the azimuthally asymmetric region of different resistivity on the element. When the selected region of the substrate slows down over more resistive portion of the element, the ionic current crowding at this selected region of the substrate can be reduced. This method can provide advantages over a method that involves correcting azimuthal non-uniformity by slowing down the selected azimuthally asymmetric region over an azimuthally asymmetric shield (or a portion of an element with completely blocked holes), because the azimuthally asymmetric region of different resistivity, unlike a shield, is ionically permeable, and therefore the variation in the plating current experienced by the wafer substrate may be less abrupt.

EXAMPLES

The uniformity of copper electroplating on a circular substrate having a diameter of 300 mm and a copper seed layer having a thickness of 500 Å, was studied using computational modeling.

Example 1

Figure 8:
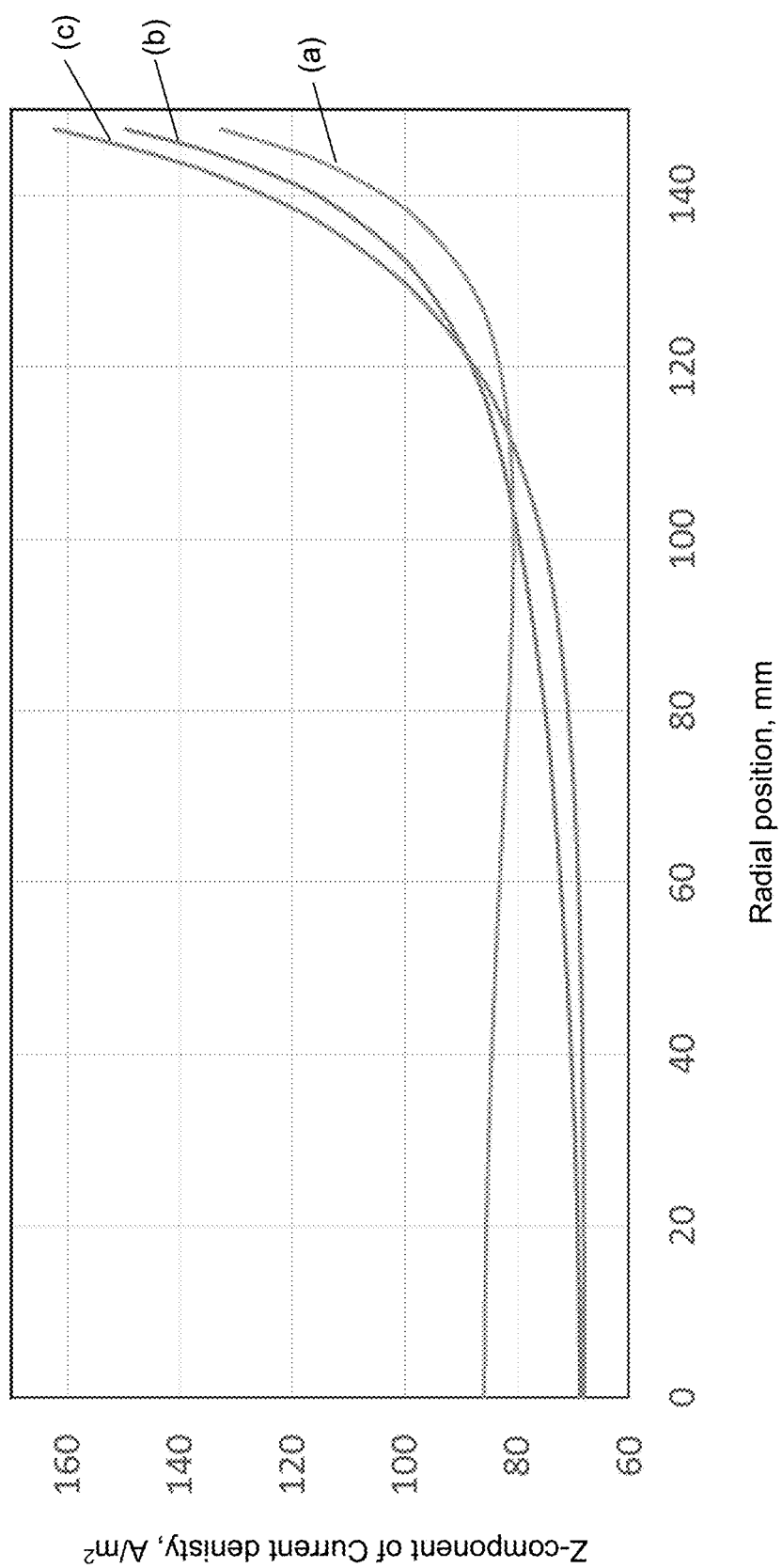
FIG. 8 is a computational modeling plot showing current density profiles for electroplating with different types of ionically resistive ionically permeable elements.

Referring to FIG. 8, plots of z component of current density (which directly correlates with plating thickness) as a function of radial distance on the wafer substrate, are shown. The zero on the X-axis corresponds to the center of the wafer; 150 mm on the X-axis corresponds to an edge of a 300 mm wafer.

Curve (a) on FIG. 8 was obtained by modeling electroplating in a system having an ionically resistive ionically permeable element having a flat top wafer-facing surface, and a convex opposite surface. This element has a varied local resistivity, which diminishes from the edge of the element towards the center of the element. The element is coextensive with the wafer and is located within 2.5 mm of the wafer (referring to the distance between the plating surface of the wafer and the wafer-facing surface of the element). The thickness of the element at the edge is 21 mm, and at the center is 12.5 mm. The thickness of the element gradually decreases in a radial direction from the edge of the element toward the center of the element following equation (2):

$$t=0.38649858-0.00052899r-0.01118511r^2 \qquad (2),$$

This is a second-order polynomial equation, where t is the thickness of the element, and r is the radial position. The porosity of the element is uniform and is equal to 4%.

Curve (b) was obtained by modeling using the same parameters, but the ionically resistive ionically permeable element has a uniform resistivity, a uniform thickness of 12.5 mm and its wafer-facing surface and the opposing surface are both flat and parallel to each other.

Curve (c) was obtained by modeling using the same parameters, but the ionically resistive ionically permeable element has a uniform resistivity, a uniform thickness of 12.5 mm and both its wafer-facing surface and the opposing surface are convex. The distance from the wafer-facing surface of the element to the plating surface of the wafer is 4.5 mm in the center of the element, and is 13 mm at the edge of the wafer.

It can be seen from the curves (a), (b), and (c), that curve (a) which corresponds to electroplating with an element having varied local resistivity results in the most uniform radial distribution of the plating current. The most pronounced gains in plating uniformity (in comparison with elements having uniform resistivity) are obtained in the center and mid-radius range.

Figure 9:
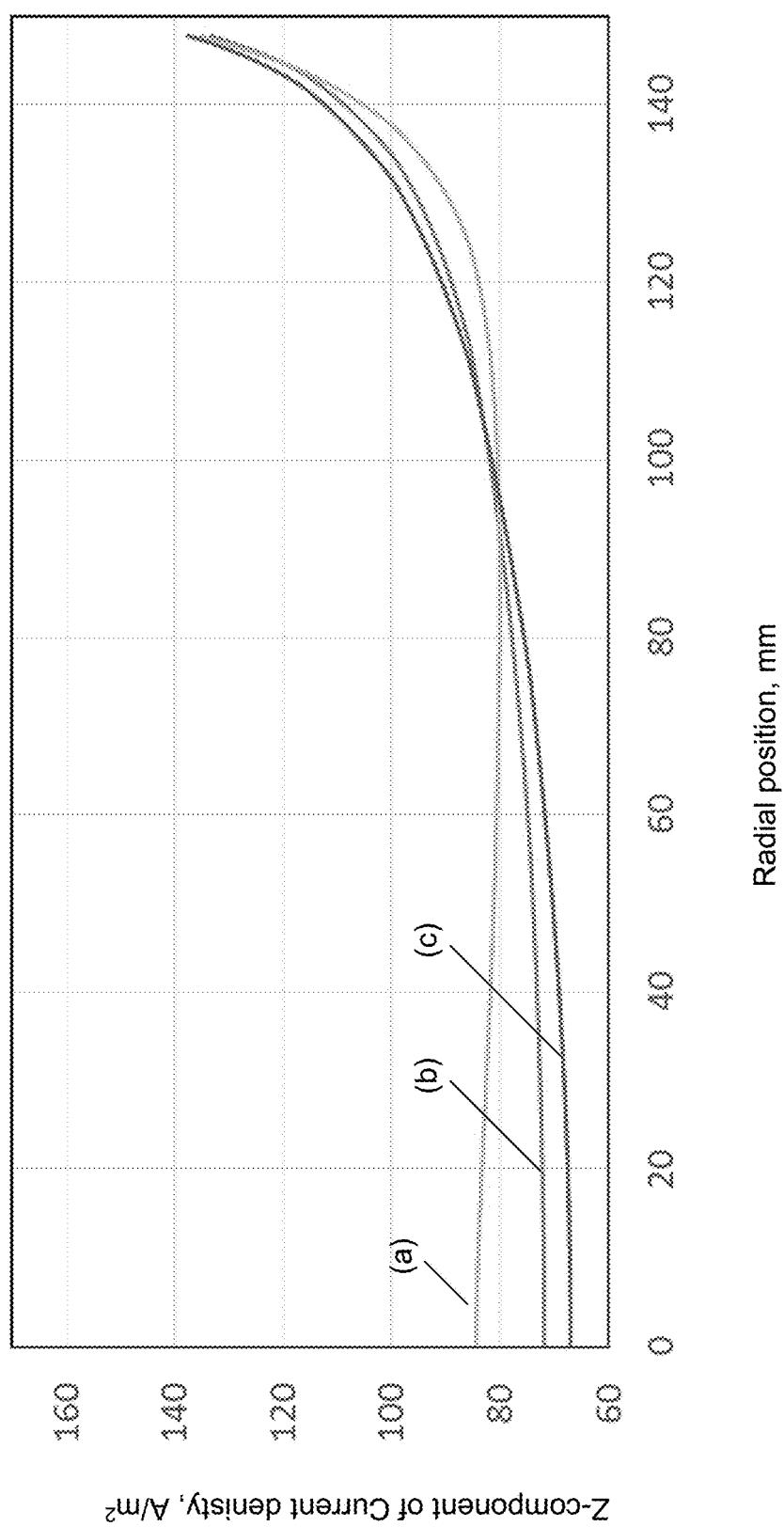
FIG. 9 is a computational modeling plot showing current density profiles for electroplating with different types of ionically resistive ionically permeable elements.

FIG. 8 illustrates that uniformity can be improved by using an element of variable thickness and constant porosity. FIG. 9 illustrates that uniformity can be improved by using an element of variable porosity and constant thickness.

Example 2

Referring to FIG. 9, plots of z component of current density (which directly correlates with plating thickness) as a function of radial distance on the wafer substrate are shown. The zero on the X-axis corresponds to the center of the wafer; 150 mm on the X-axis corresponds to an edge of a 300 mm wafer.

Curve (a) on FIG. 9 was obtained by modeling electroplating in a system having an ionically resistive ionically permeable element having a flat top wafer-facing surface, and a flat opposite surface. This element has a uniform thickness of 12.5 mm. The element is coextensive with the wafer and is located within 2.25 mm of the wafer (referring to the distance between the plating surface of the wafer and the wafer-facing surface of the element). The local porosity of the element at the edge is 4%, and at the center is 8%. The local porosity of the element gradually decreases in a radial direction from the edge of the element toward the center of the element. In the depicted example the porosity decreases towards the center following a linear function.

Curve (b) was obtained by modeling using the same parameters, but the ionically resistive ionically permeable element has a uniform porosity of 4%.

Curve (c) was obtained by modeling using the same parameters, but the ionically resistive ionically permeable element has a uniform porosity of 8%.

It can be seen from the curves (a), (b), and (c) that curve (a) which corresponds to electroplating with an element having varied local resistivity results in the most uniform radial distribution of the plating current. The most pronounced gains in uniformity (in comparison with elements having uniform resistivity) are obtained in the center and mid-radius range.

Example 3

Figure 10:
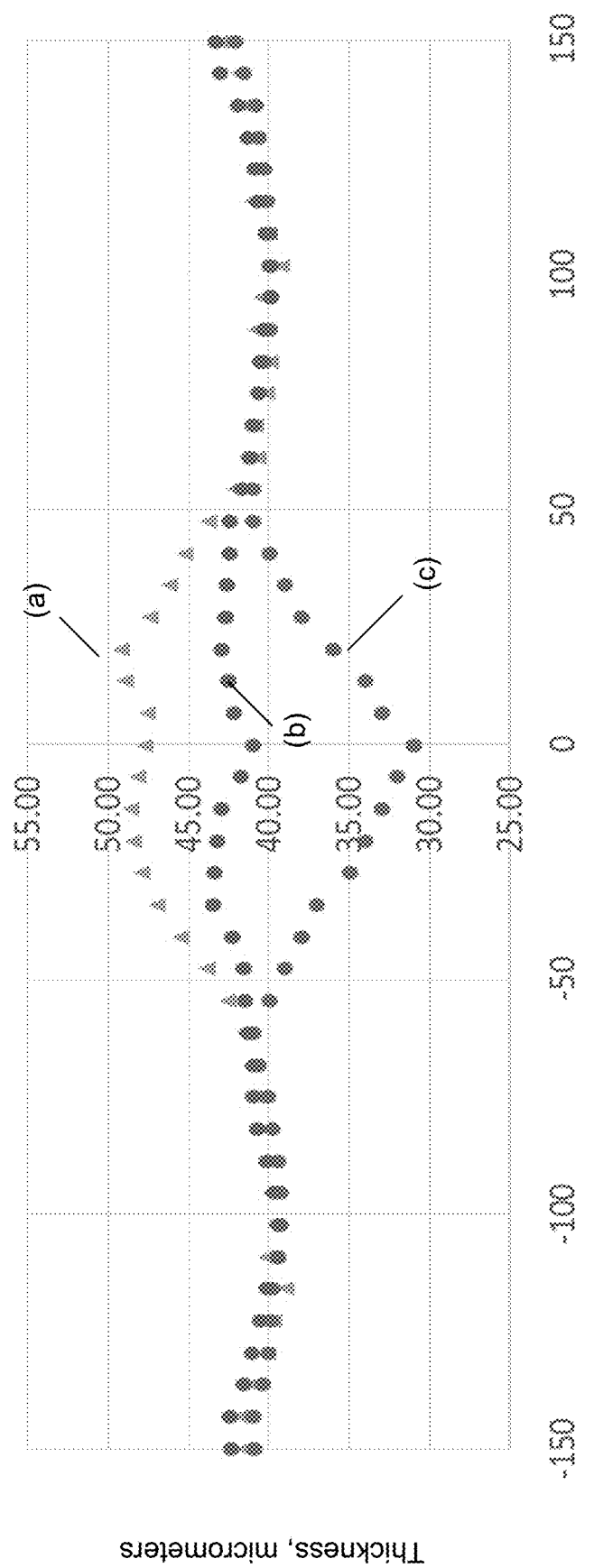
FIG. 10 is a plot showing current density profiles for electroplating with different types of ionically resistive ionically permeable elements.

FIG. 10 illustrates experimental (curves (b) and (c)) and extrapolated (curve (a)) examples for electroplating copper on uniform and non-uniform wafers using different types of ionically resistive ionically permeable elements. Curves (a) and (b) were obtained using an element having spatially profiled thickness (and resistivity), as shown in FIG. 2G. The element contained an annular region of constant thickness and constant resistivity at the outer portion of the element. This region had a width D1=90 mm and a constant thickness of 12.7 mm. The inner portion of the element (corresponding to the inner diameter D2 of 120 mm) had variable thickness, wherein the thickness was gradually reduced in a radial direction from 12.7 mm at the interface with the outer portion of the element to 6.35 mm at the center of the element. Curve (c) was obtained using an element having constant resistivity and constant thickness of 12.7 mm throughout the element. Curve (a) is a computational curve for electroplating on a uniform wafer. Curves (b) and (c) were obtained for electroplating on a non-uniform wafer having a center-thick layer of photoresist, where the thickness of photoresist in the outer portion of the wafer is constant and is equal to about 63 micrometers, while the photoresist in the inner portion of the wafer (corresponding to inner diameter of 120 mm) had variable thickness, wherein the thickness of photoresist gradually increased in a radial direction from 63 micrometers at the interface with the outer portion of the wafer to about 78 micrometers at the center of the wafer.

It can be seen from FIG. 10 that the resistivity-profiled element effectively compensates for non-uniformity generated by center-thick photoresist. Specifically, curve (a) illustrates that if a uniform wafer is used with an element having thinned out center, the result would be center-thick electroplating. Curve (c) illustrates that if a wafer having center-thick photoresist is used with an element of a uniform thickness, this would lead to center-thin electroplating. Finally, curve (b) shows that if a wafer having center-thick photoresist is matched with a center-thin element (such as shown in FIG. 2G), then significantly more uniform electroplating is observed.

Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the parameters of delivery of power to primary anode, secondary electrode, and the substrate. Specifically, the controller may provide instructions for timing of application of power, level of power applied, etc.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The invention claimed is:

1. An ionically resistive ionically permeable element for use in electrochemical processing of substrates, wherein the element allows for flow of ionic current through the element during electrochemical processing, and wherein the element comprises a region having gradually varied local resistivity.

2. The ionically resistive ionically permeable element of claim 1, wherein the region having gradually varied local resistivity is coextensive with the element and wherein the local resistivity in said region decreases radially from an edge of the element to the center of the element.

3. The ionically resistive ionically permeable element of claim 1, wherein the element comprises a region of constant local resistivity surrounding the region of gradually varied local resistivity, wherein the region of gradually varied local resistivity is located in a central portion of the element and wherein the local resistivity in the region of gradually varied local resistivity decreases radially from an interface with the region of constant local resistivity to the center of the element.

4. The ionically resistive ionically permeable element of claim 1, wherein the element has a gradually varied thickness and constant porosity in the region having gradually varied local resistivity.

5. The ionically resistive ionically permeable element of claim 1, wherein the element has a gradually varied porosity and constant thickness in the region having gradually varied local resistivity.

6. The ionically resistive ionically permeable element of claim 1, wherein the element has both gradually varied porosity and gradually varied thickness in the region having gradually varied local resistivity.

7. The ionically resistive ionically permeable element of claim 1, wherein the element has a plurality of non-communicating channels made through an ionically resistive material and connecting a first surface of the element with the opposite surface of the element, wherein the element allows for movement of the electrolyte through the channels.

8. The ionically resistive ionically permeable element of claim 7, wherein the region having gradually varied local resistivity has a gradually varied density of the non-communicating channels.

9. The ionically resistive ionically permeable element of claim 7, wherein the region having gradually varied local resistivity has a gradual variation in diameter of the non-communicating channels.

10. The ionically resistive ionically permeable element of claim 7, wherein the region having gradually varied local resistivity has a gradual variation in an incline angle of the non-communicating channels relative to a plane defined by the first surface of the element.

11. The ionically resistive ionically permeable element of claim 1, wherein the region having gradually varied local resistivity is coextensive with the element and wherein the local resistivity in said region decreases radially from an edge of the element to the center of the element due to gradually decreasing thickness of the element from the edge of the element to the center of the element.

12. The ionically resistive ionically permeable element of claim 11, wherein the element has a convex surface that follows a second order polynomial function, when viewed in a radial cross-section.

13. The ionically resistive ionically permeable element of claim 1, wherein the element comprises a region of constant thickness surrounding the region having gradually varied local resistivity, wherein the region having gradually varied local resistivity is located in a central portion of the element and wherein the thickness of the element in the region having gradually varied local resistivity decreases radially from an interface with the region of constant thickness to the center of the element.

14. The ionically resistive ionically permeable element of claim 1, wherein the element has a variable thickness, and wherein the thickness variation is between about 3-100% of the greatest thickness of the element.

15. A method of electroplating metal on a semiconductor substrate comprising a plurality of recessed features, the method comprising:
   (a) providing the substrate to a plating chamber configured to contain an electrolyte and an anode while electroplating metal onto the substrate, wherein the plating chamber includes:
      (i) a substrate holder holding the substrate such that a plating face of the substrate is separated from the anode during electroplating, and
      (ii) an ionically resistive ionically permeable element, wherein the element allows for flow of ionic current through the element towards the substrate during electroplating, and wherein the element comprises a region having gradually varied local resistivity, and
   (b) electroplating a metal onto the substrate plating surface while cathodically biasing and rotating the semiconductor substrate.

16. The method of claim 15, wherein the element comprises a region of constant local resistivity surrounding the region of gradually varied local resistivity, wherein the region of gradually varied local resistivity is located in a central portion of the element and wherein the local resistivity in the region of gradually varied local resistivity decreases radially from an interface with the region of constant local resistivity to the center of the element.

17. An electroplating apparatus comprising:
   (a) a plating chamber configured to contain an electrolyte and an anode while electroplating metal onto a semiconductor substrate;
   (b) a substrate holder configured to hold the semiconductor substrate such that a plating face of the substrate is separated from the anode during electroplating;
   (c) an ionically resistive ionically permeable element, wherein the element allows for flow of an ionic current through the element towards the substrate during electroplating, and wherein the element comprises an azimuthally asymmetric ionically permeable region having an average resistivity that is different from the average resistivity of the rest of the element, wherein said region is located at a periphery of the element and has an area of at least 0.35% of the total area of a substrate-facing surface of the element.

18. The apparatus of claim 17, wherein the azimuthally asymmetric ionically permeable region having an average resistivity that is different from the average resistivity of the rest of the element has a different average porosity from the rest of the element.

19. The apparatus of claim 17, wherein the azimuthally asymmetric ionically permeable region having an average resistivity that is different from the average resistivity of the rest of the element has a different average thickness from the rest of the element.

20. The apparatus of claim 17, wherein the azimuthally asymmetric ionically permeable region having an average resistivity that is different from the average resistivity has a greater average resistivity than the rest of the element.

21. A method of electroplating a metal on a semiconductor substrate while controlling azimuthal uniformity, the method comprising:
   (a) providing the semiconductor substrate into an electroplating apparatus of claim 17; and
   (b) electroplating the metal on the substrate while rotating the substrate relative to the ionically resistive ionically permeable element such that a selected portion of the substrate at a selected azimuthal position dwells proximate the azimuthally asymmetric ionically permeable region having an average resistivity that is different from the average resistivity of the rest of the element, for a different amount of time than a second portion of the substrate having the same average arc length and the same average radial position and residing at a different angular azimuthal position.

22. The method of claim 21, comprising rotating the selected portion of the substrate at a selected azimuthal position at a first speed and then slowing the rotation to a lower speed, when the selected portion of the substrate becomes proximate to the azimuthally asymmetric ionically permeable region having an average resistivity that is different from the average resistivity of the rest of the element.

* * * * *